(12) United States Patent
Suzuki et al.

(10) Patent No.: US 7,518,275 B2
(45) Date of Patent: Apr. 14, 2009

(54) VIBRATOR AND PORTABLE TERMINAL DEVICE MOUNTED WITH THE VIBRATOR

(75) Inventors: Toshio Suzuki, Tokyo (JP); Minoru Ueda, Tokyo (JP); Tsuyoshi Takano, Tokyo (JP)

(73) Assignee: Namiki Seimitsu Houseki Kabushiki Kaisha, Tokyo (JP)

( * ) Notice: Subject to any disclaimer, the term of this patent is extended or adjusted under 35 U.S.C. 154(b) by 228 days.

(21) Appl. No.: 10/547,672

(22) PCT Filed: Mar. 2, 2004

(86) PCT No.: PCT/JP2004/002539

§ 371 (c)(1),
(2), (4) Date: Oct. 27, 2006

(87) PCT Pub. No.: WO2004/078366

PCT Pub. Date: Sep. 16, 2004

(65) Prior Publication Data

US 2007/0085495 A1  Apr. 19, 2007

(30) Foreign Application Priority Data

Mar. 3, 2003 (JP) .............................. 2003-055955

(51) Int. Cl.
- B06B 1/04 (2006.01)
- B06B 1/16 (2006.01)
- H02K 7/065 (2006.01)
- H02K 5/22 (2006.01)

(52) U.S. Cl. .......................................... 310/81; 310/71
(58) Field of Classification Search .................... 310/71, 310/81

See application file for complete search history.

(56) References Cited

U.S. PATENT DOCUMENTS 5,943,214 A * 8/1999 Sato et al. .................... 361/752

(Continued)

FOREIGN PATENT DOCUMENTS

EP 1463180 * 9/2004

(Continued)

*Primary Examiner*—Burton Mullins
(74) *Attorney, Agent, or Firm*—Studebaker & Brackett PC; Donald R. Studebaker

(57) ABSTRACT

In order to improve the reliability of an electrical connection between a power supply terminal of a vibrator and an electrode of a circuit board and to improve the efficiency of mounting the vibrator on the circuit board, the power supply terminal is made from a torsion coil spring and a contact portion of the power supply terminal in contact with the electrode of the circuit board is formed by winding. In addition, a torsion coil spring portion is wound around a spindle pin and a housing is provided with a step portion as a space for accommodating the contact portion without interference and a plane portion to which the contact portion faces. Moreover, a partition plate is provided between a pair of power supply terminals or a space where the contact portion can be elastically deformed is surrounded by a box member, a pair of power supply terminals having positive and negative polarities are extended in a bilaterally symmetric direction from torsion coil spring portions to the contact portions, and the power supply terminals are constructed so as to be elastically deformed to allow each contact portion to reach the outside of each torsion coil spring portion.

12 Claims, 22 Drawing Sheets

U.S. PATENT DOCUMENTS 6,093,036 A * 7/2000 Tohgo et al. .................. 439/83
6,740,999 B1 * 5/2004 Segawa ....................... 310/81

FOREIGN PATENT DOCUMENTS

| | | |
|---|---|---|
| JP | 10117460 | 5/1998 |
| JP | 11136327 | 5/1999 |
| JP | 2002044904 | 2/2002 |
| JP | 2002044907 | 2/2002 |
| JP | 2003174753 | 6/2003 |
| WO | 03098779 | * 11/2003 |

* cited by examiner

Prior Art

Prior Art

VIBRATOR AND PORTABLE TERMINAL DEVICE MOUNTED WITH THE VIBRATOR

TECHNICAL FILED

This invention relates to a vibrator used as a vibration generating system for a portable terminal device etc.

BACKGROUND ART

Conventionally, when a vibrator used as a vibration generating system for a portable terminal device represented by a mobile phone is electrically connected to a circuit board mounted on the aforementioned portable terminal device, a method that a power supply terminal of the aforementioned vibrator and electrodes on the aforementioned circuit board are connected through a lead wire by soldering has been used. However, since it is necessary for the lead wire to be positioned and soldered on the aforementioned electrodes by a worker, the many man-hours for installation require much labor and time.

As a means to solve these problems, a vibrator having leaf spring-like power supply terminals (hereafter referred to as leaf spring terminal) is proposed. This allows a power supply to a vibrator only by pressing the power supply terminals onto the aforementioned electrodes. Since disuse of a lead wire enables not only omission of positioning work by a worker but also omission of soldering between the power supply terminals and electrodes, the proposal is effective from the viewpoint of reducing installation man-hours, labor, and time.

However, in order to form a leaf spring terminal, punching work using a die or a press is required. Therefore, manufacturing processes for vibrators, including a process for forming leaf spring terminals, are complicated and expensive. In addition, since remaining materials produced by punching with a press to manufacture the power supply terminals are scrapped, the yield of materials is not so high. Moreover, the necessity of parts for supporting the leaf spring terminals inside the vibrator results in an increase in the number of parts.

Recently assembly manufacturers that mount the vibrator on the surface of the aforementioned circuit board often request a supply of power supply terminals having various shapes. In order to satisfy these requirements using a leaf spring terminal, it is necessary to change a die from the design stage, that is to say, the shape change of the power supply terminal is complicated and takes much time. Therefore, it is difficult to manufacture a vibrator equipped with power supply terminals satisfying the requirements easily and quickly at low cost.

The leaf spring terminal easily shows a permanent set due to plastic deformation and there is a possibility that repetitive loads acting on the leaf spring terminal cause deterioration of springiness of the leaf spring terminal.

Thus a vibrator of which power supply terminals are formed using torsion coil springs that still maintain the advantages of the aforementioned leaf spring terminal and can solve the problems as shown in, for example, Patent Reference 1: Patent Application No. 2002-44904 (FIG. 1 in page 3-5), was proposed.

FIG. 21 shows a vibrator 100 equipped with the abovementioned power supply terminals. A power supply terminal 101 has a torsion coil spring portion 103 formed by winding a part of a conductive rod member 102. A portion close to an end portion 104 of the power supply terminal 101 is provided with a bending portion 105 bent at a specified angle. As shown in (A) and (B) of FIG. 22, when the vibrator 100 is mounted on a surface of a circuit board 106, the bending portion 105 is made in contact with an electrode 107 of the circuit board 106 at contact point P1.

In the abovementioned vibrator, the power supply terminal 101 is formed using a rod member 102 to make the aforementioned die unnecessary, processes and time for forming terminals are reduced, and generation of permanent set seen in the aforementioned leaf spring terminal is prevented.

However, when vibration generated by the vibrator 100 or a load acting from the outside of the aforementioned portable terminal device (for example, a drop shock load caused when a user dropped the portable terminal device) results in displacement of the relative position between the vibrator 100 and the circuit board 106, a contact point P1 of the bending portion 105 and the electrode 107 naturally shift from an original position. If an amount of shift is larger than the length or width of the electrode 107, a contact point P1 moves to the outside of the electrode 107. As a result, the power supply terminal 101 is electrically disconnected, resulting in inactivation of the vibrator 100.

Since a construction of the vibrator 100 shown in FIGS. 21 and 22 provides an electrical connection between the electrode 107 and the power supply terminal 101 at only one point, a contact point P1 easily shifts to the outside of the electrode 107 and reliability of the power supply performance to the vibrator 100 is extremely low.

In addition, a characteristic that the power supply terminal 101 shifts laterally more easily than that of a leaf spring type depending on a pressing force acting on the power supply terminal 101 when the power supply terminal is mounted on the circuit board 106 because the power supply terminal 101 is formed using a rod-shaped torsion coil spring is found. Therefore, there arises a problem that, in comparison with the leaf spring terminal, the direction of the elastic deformation of the power supply terminal 101 cannot be kept invariable and a contact position with the electrode 107 cannot be fixed, thus resulting in a problem that the efficiency of mounting the vibrator 100 on the surface of the circuit board 106 decreases.

Furthermore, a characteristic of the torsion coil spring is that a tip of the torsion coil spring easily inclines in a winding direction of the torsion coil spring (directions of arrows d and e in FIG. 21), resulting in a change of an elastic pressing force against the electrode 107. Therefore, the aforementioned elastic pressing force becomes insufficient or excessive if circumstances require. Since insufficiency of the aforementioned pressing force makes it difficult to sufficiently press the bending portion 105 of the power supply terminal 101 onto the electrode 107, generation of vibration by driving the vibrator 100 makes a contact between the electrode 107 and the power supply terminal 101 unstable, leading to fluctuation. On the other hand, since an excess of the aforementioned pressing force results in an excessively strong pressing force of the bending portion 105 acting on the electrode 107, the electrode 107 is ground by the bending portion 105 due to friction between the bending portion and the electrode caused by the vibration of the driven vibrator 100, also leading to unstable contact between the electrode 107 and the power supply terminal 101.

There also is a problem that fluctuation of a contact between the power supply terminal 101 and the electrode 107 makes an end portion 104 of the fluctuated power supply terminal in contact with and in interference with a part other than the electrode 107 mounted on the surface of the circuit board 106, leading to the incapability of providing a desired pressing load and spring performance.

Generally speaking, a vibrator to be installed to a portable terminal device is required to realize further size and weight reduction because the portable terminal device itself is required to achieve size and weight reduction, and a mounting space is reduced due to the necessity of a mounting space for other parts (such as camera lens) associated with a provision of multifunctions to the portable terminal device. Size reduction of the vibrator itself results in size reduction of the power supply terminal. Since a rod-shaped member is used for the power supply terminal made from a torsion coil spring, it is necessary to reduce a diameter of the rod-shaped member to realize size and weight reduction. Since the reduction of the diameter naturally decreases strength, the power supply terminal can be easily deformed by a sudden load acting from the outside of the portable terminal device (such as a drop shock load caused when a user dropped the portable terminal device), leading to low reliability of power supply performance of a vibrator.

The purpose of this invention presented from the viewpoint of the above problems is to provide a vibrator of which a power supply terminal is made from a torsion coil spring and which has improved reliability on an electrical connection between a power supply terminal and electrode.

In addition, the purpose of this invention is to provide a vibrator of which a power supply terminal is made from a torsion coil spring and which has improved efficiency of mounting the vibrator on the surface of the circuit board.

DISCLOSURE OF INVENTION

An embodiment of the present invention provides a vibrator comprising a vibration generating mechanism, a housing that accommodates at least a part of the vibration generating mechanism, and a pair of power supply terminals having positive and negative polarities protruding from the aforementioned housing that are electrically connected to electrodes of a circuit board mounted on a portable terminal device and that supply power to the aforementioned vibration generating mechanism, wherein the aforementioned power supply terminal is made from a torsion coil spring having a torsion coil spring portion that is wound around a part of a conductive rod-shaped member having springiness and a contact portion of the aforementioned power supply terminal to be in contact with the aforementioned electrode is formed by winding.

Another embodiment of the present invention provides a vibrator, wherein the aforementioned vibrator is a vibration motor having an eccentric weight in the invention.

Another embodiment of the present invention provides a vibrator, wherein the aforementioned vibrator is a vibrator having an oscillator of a reciprocating motion type.

Another embodiment of the present invention provides a vibrator, wherein the aforementioned housing is provided with spindle pins, the aforementioned torsion coil spring portion is formed by winding the aforementioned rod-shaped member around the aforementioned spindle pin in the vibrator, and the aforementioned housing is provided with a step portion as a space for allowing the aforementioned contact portion to freely move at an elastic deformation of the aforementioned power supply terminal and a plane portion to which the aforementioned contact portion of the aforementioned power supply terminal elastically deformed faces.

An edge of the aforementioned plane portion located close to the aforementioned contact portion of the aforementioned power supply terminal before elastic deformation can be provided with a tapered surface as required.

Another embodiment of the present invention provides a vibrator, wherein, on a plan view of the aforementioned vibrator in a condition that the aforementioned vibrator is mounted on the aforementioned circuit board, the aforementioned contact portion is elastically deformed toward the outside of the aforementioned housing so that the contact portions do not overlap with the aforementioned housing.

Another embodiment of the present invention provides a vibrator, wherein a partition plate is provided between the aforementioned pair of power supply terminals in the aforementioned vibrator.

Another embodiment of the present invention provides a vibrator, wherein a partition plate is provided between the aforementioned pair of power supply terminals, the aforementioned partition plate is provided with a spindle pin, the aforementioned torsion coil spring portion is formed by winding the aforementioned rod-shaped member around the aforementioned spindle pin, and the aforementioned partition plate is provided with a step portion as a space for allowing the aforementioned contact portion to freely move at an elastic deformation of the aforementioned power supply terminal and a plane portion to which the aforementioned contact portion of the aforementioned power supply terminal elastically deformed faces in the vibrator.

Another embodiment of the present invention provides a vibrator, wherein at least a part of the contact portion of the aforementioned pair of power supply terminals is partitioned by the aforementioned partition plate in the aforementioned vibrator.

Another embodiment of the present invention provides a vibrator, wherein an edge of the partition plate located close to the aforementioned power supply terminals is provided with a tapered surface.

Another embodiment of the present invention provides a vibrator, wherein the power supply terminals having positive and negative polarities are constituted so as to extend in a bilaterally symmetric direction from the aforementioned torsion coil spring portions of the aforementioned power supply terminals to the aforementioned contact portion and the vibrator is constructed so that the aforementioned power supply terminals are elastically deformed to allow each contact portion to reach the outside of each torsion coil spring portion.

Another embodiment of the present invention provides a vibrator, wherein, when the aforementioned vibrator is mounted on the aforementioned circuit board, at least a part of a space where the aforementioned contact portion can be elastically deformed is surrounded by an insulation box member in the vibrator.

Another embodiment of the present invention provides a portable terminal device comprising a vibration generation mechanism having an eccentric weight or a reciprocating oscillator, a housing for accommodating at least a part of the vibration generation mechanism, and a pair of power supply terminals that protrude from the aforementioned housing and have positive and negative polarities to supply power to the aforementioned vibration generation mechanism, wherein the aforementioned power supply terminal comprises a torsion coil spring wound around a part of a conductive rod-shaped member having springiness, a contact portion of the aforementioned power supply terminal in contact with the aforementioned electrode is formed by winding, and the contact portion of the aforementioned power supply terminal is pressed toward a circuit board in the aforementioned device to be in contact with the electrode of the circuit board to be mounted on the portable terminal device to realize electrical connection in the vibrator.

BEST MODE FOR CARRYING OUT THE INVENTION

First Embodiment

Now, a construction of the first embodiment relating to this invention is described referring to FIGS. 1 through 6. In the first embodiment, as a form of a vibrator, a vibration motor of a type that an eccentric weight is fixed to an end of a rotating shaft not illustrated is described as an example.

Figure 1:
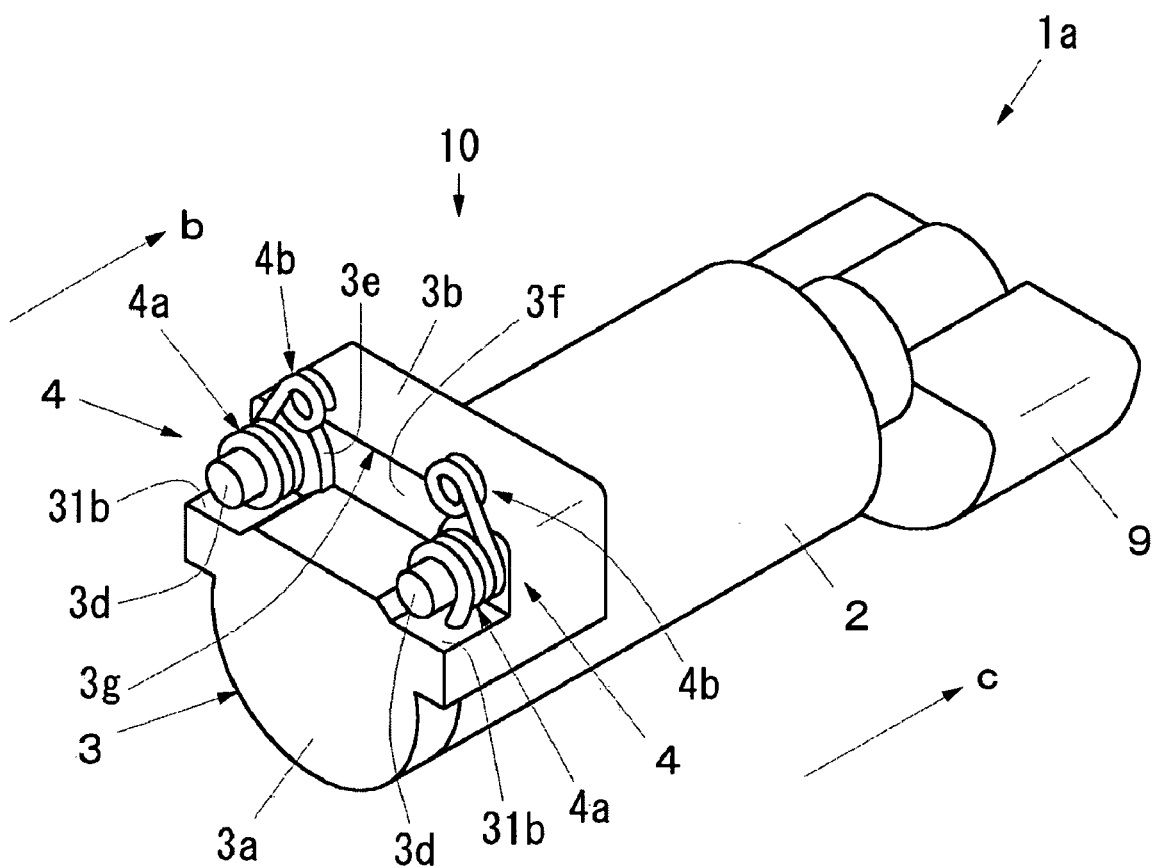
FIG. 1 is a perspective view of a vibrator relating to the first embodiment of this invention.
Figure 2:
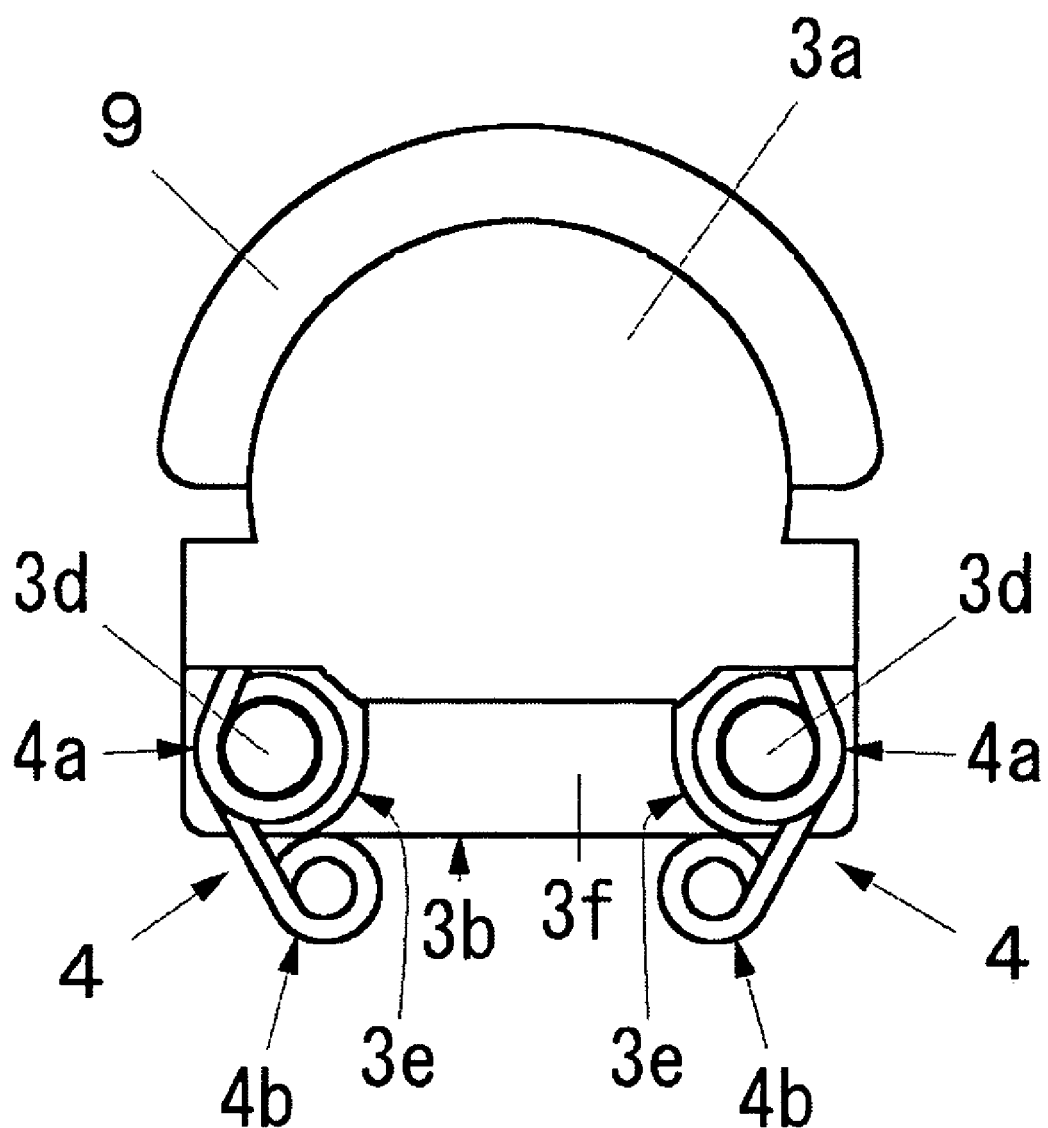
FIG. 2 is a rear view of the vibrator shown in FIG. 1 turned upside down and viewed from a power supply terminal side.

As shown in FIG. 1, in a vibration motor 1a, an eccentric weight 9 is fixed to an end of a rotating shaft not illustrated, and a drive mechanism for rotationally driving the rotating shaft is accommodated inside a motor housing 2. A vibration generation mechanism is composed of the aforementioned drive mechanism and the eccentric weight 9. The aforementioned drive mechanism is composed of a stator and a rotor not illustrated. An end of the motor housing 2 is provided with a bracket 3, and a housing 10 is composed of the motor housing 2 and the bracket 3. The bracket 3 is made of a plastic material or another insulation material, and have a main body 3a to be fit into an end of the motor housing 2 and a terminal block portion 3b formed integrally with the aforementioned main body 3a and provided along an external peripheral surface of the motor housing 2. The main body 3a is formed in a shape almost corresponding to an outline of the housing 2 so as to enable engagement with an end of the housing 2.

The bracket 3 is provided with a pair of power supply terminals 4 having positive and negative polarities so that the power supply terminals extend from a plane 31b of the terminal block 3b. Therefore, the power supply terminals 4 protrude from the housing 2. An end of the power supply terminal 4 is connected to a brush (not illustrated) assembled inside the main body 3a. Moreover, the terminal block 3b is provided with a spindle pin 3d made from a rod-shaped insulation material.

Figure 3:
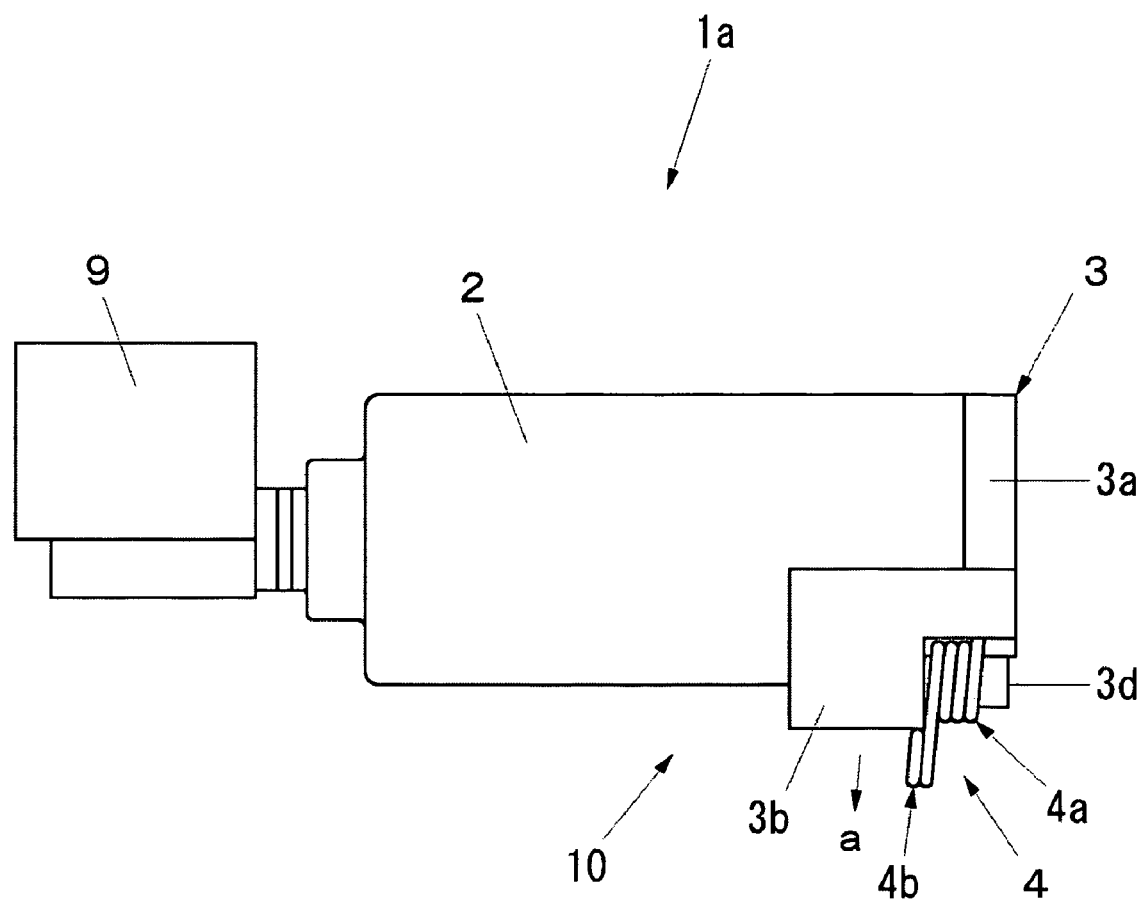
FIG. 3 is a side view of the vibrator shown in FIG. 1 turned upside down and viewed from a side.

The power supply terminal 4 is formed using a rod-shaped member made of copper alloy, such as phosphor bronze or beryllium bronze, and a white metal or iron alloy, such as stainless steel and spring steel, having springiness and conductivity. A part of the power supply terminal has a torsion coil spring portion 4a that is wound around the aforementioned spindle pin 3d several turns. A rod-shaped member is linearly extended from the other end of the torsion coil spring portion 4a. The direction of extension is in parallel with a winding direction of the torsion coil spring portion 4a (arrow a in the drawing) as shown in FIG. 3. The rod-shaped member is wound several turns at the point close to the end of the extension to form the contact portion 4b to be in contact with an electrode on a circuit board surface to be installed to a portable terminal device not illustrated.

Figure 4:
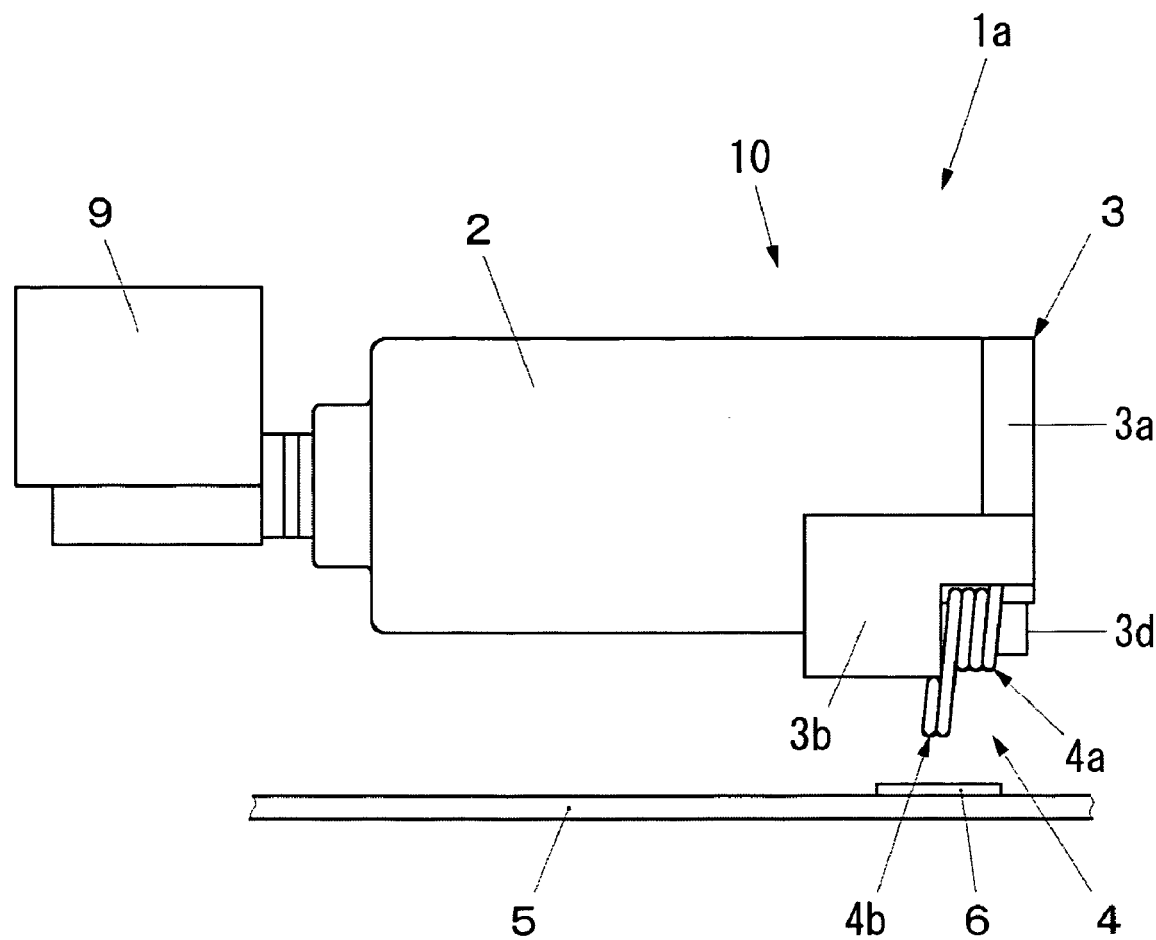
FIG. 4 is a side view representing a relative position between the vibrator and a circuit board shown in FIG. 3.
Figure 5:
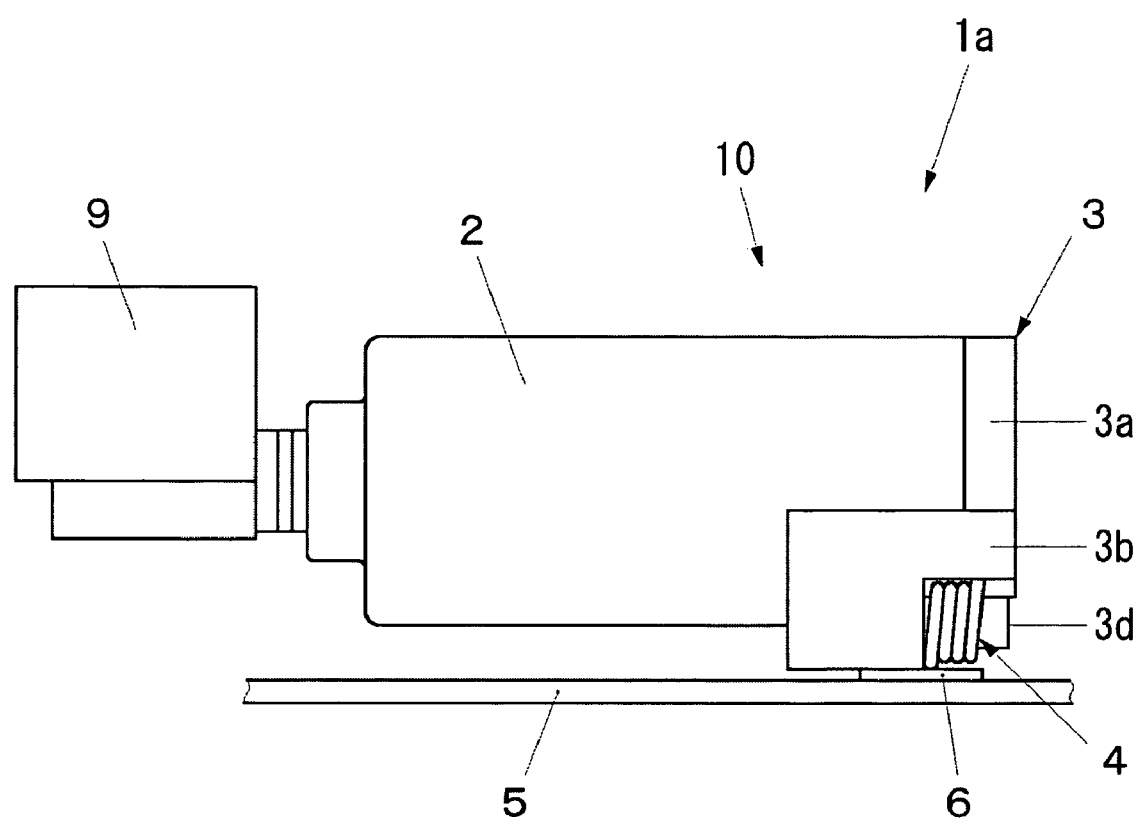
FIG. 5 is a side view of the vibrator mounted on the circuit board in the condition shown in FIG. 4.
Figure 6:
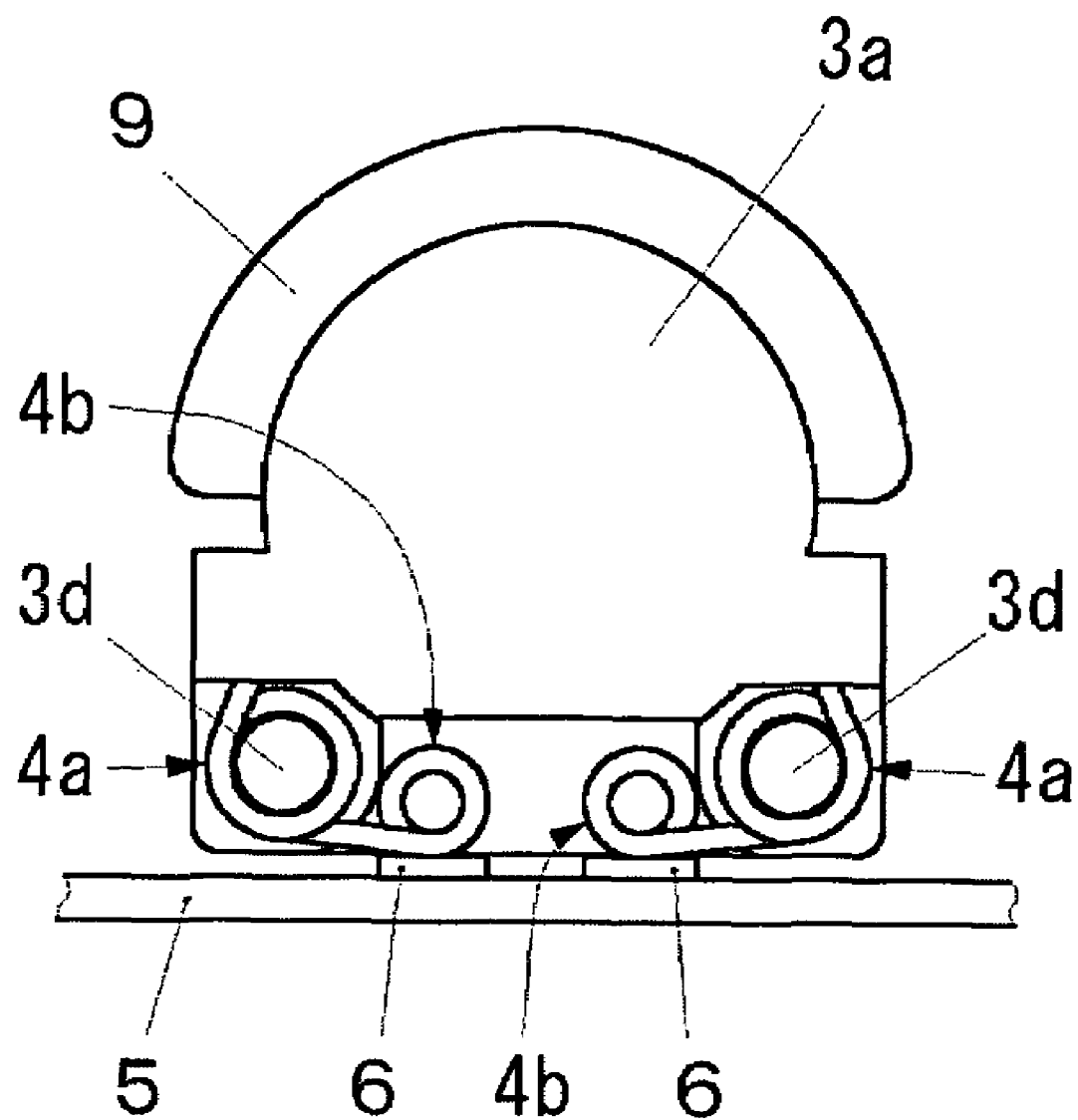
FIG. 6 is a rear view of the vibrator mounted on the circuit board shown in FIG. 5 viewed from the power supply terminal side.
Figure 7:
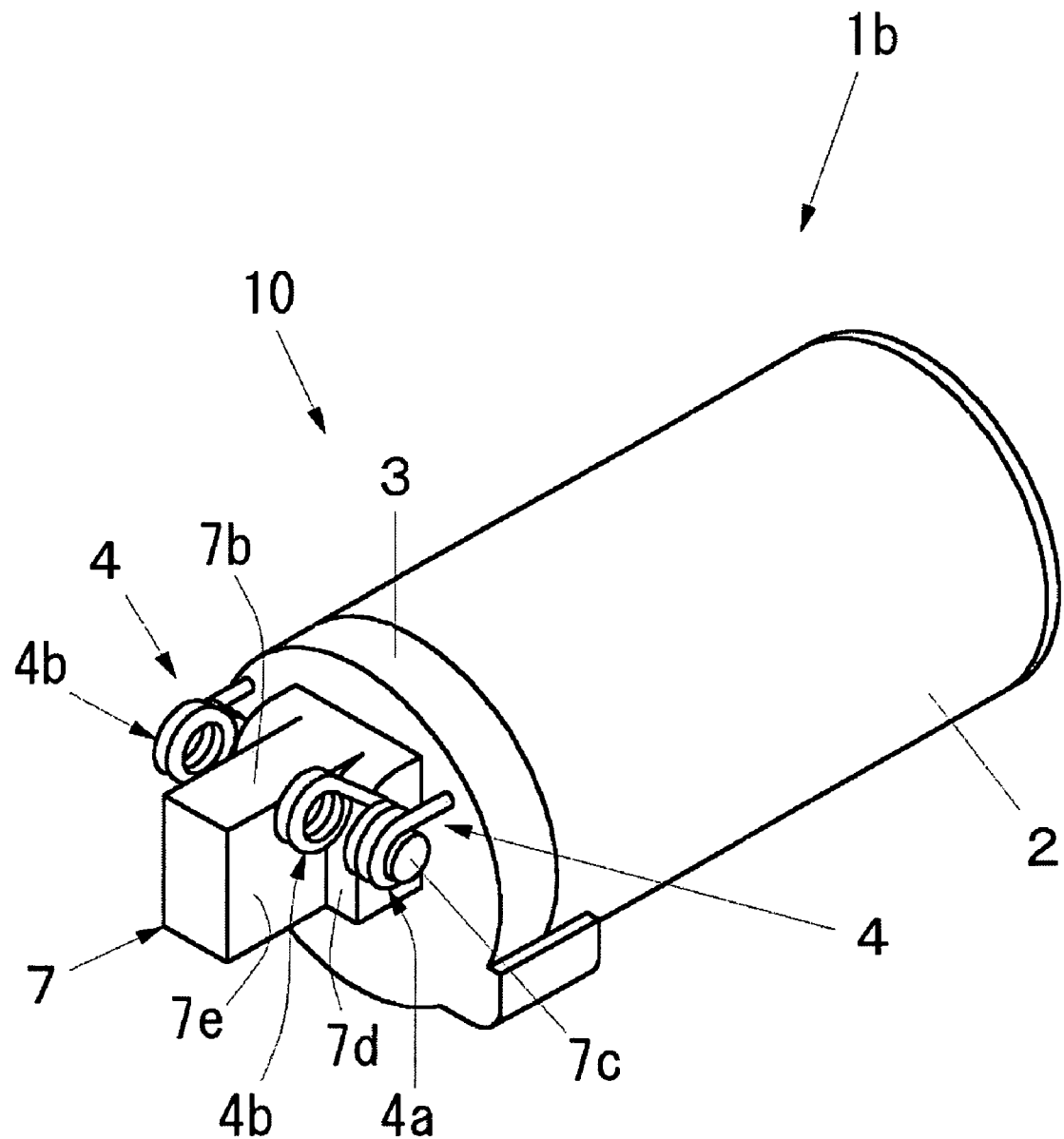
FIG. 7 is a perspective view of a vibrator relating to the second embodiment of this invention.
Figure 8:
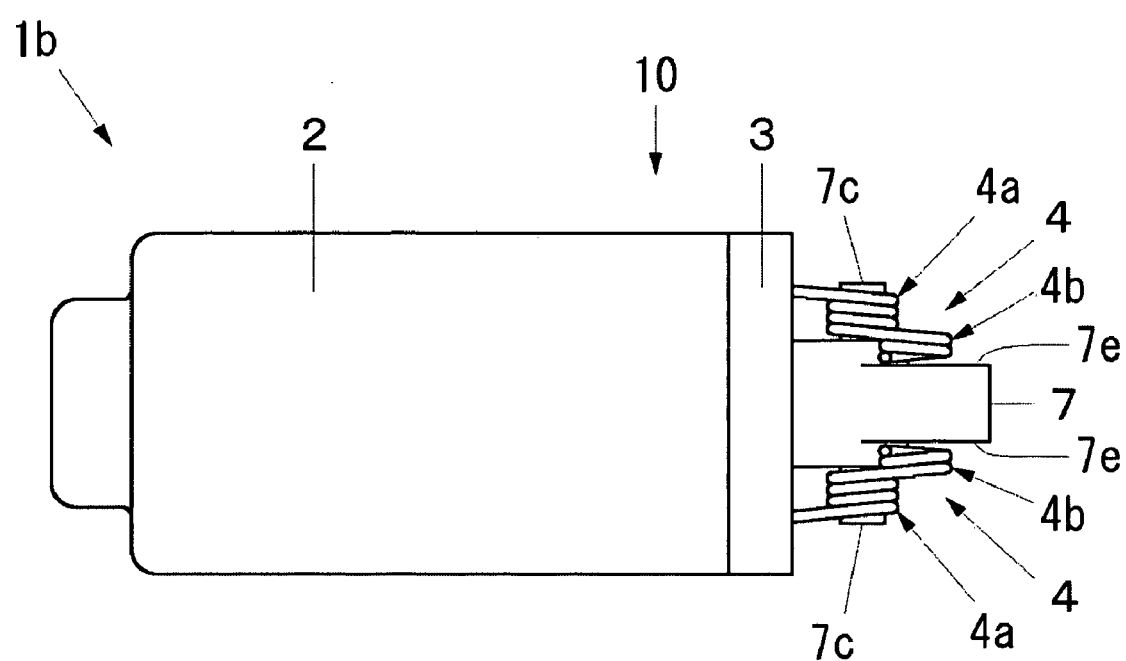
FIG. 8 is a plan view of FIG. 7.

Now, a condition that the abovementioned vibration motor 1a is mounted on the aforementioned circuit board surface is described referring to FIGS. 4 through 6. As shown in FIGS. 4 though 6, when the vibration motor 1a is mounted on the surface of the circuit board 5, the contact portion 4b contacts an electrode 6 of the circuit board 5, thus the electrode 6 is electrically connected to the aforementioned vibration generation mechanism. Since the contact portion 4b is made from rings of a rod-shaped member wound several turns, an external peripheral surface of each ring contacts the electrode 6. Therefore, the vibration motor 1a can be electrically connected to the electrode 6 at multiple contact points. The contact portion 4b of the power supply terminal 4 is elastically pressed onto the electrode 6 by a torsional moment generated around the torsion coil spring portion 4a. The terminal block portion 3b is provided with a step portion 3e and a plane portion 3f that are given as a space for enabling elastic deformation of the power supply terminal 4 without allowing the contact portion 4b to interfere with the terminal block. The contact portion 4b is arranged so that the contact portion faces the plane portion 3f when the power supply terminal 4 is elastically deformed. (See FIG. 6)

As aforementioned, since the contact portion 4b contacts the electrode 6 at multiple contact points, any one of multiple external peripheral surfaces of the aforementioned rings contacts the electrode 6 even if vibration associated with the drive of the vibration motor 1a or a shock load from an outside, such as drop shock of a portable terminal device, is added. Therefore, it is possible to improve the reliability of power supply performance at the contact portion with the electrode 6 in comparison with a conventional torsion coil spring power supply terminal of a point contact type.

The contact portion 4b itself, provided with a circular form, enables the contact point with the electrode 6 to have rigidity even if a rod-shaped member small in diameter is used. Therefore, the contact portion is hardly deformed even if the contact portion is subjected to the vibration of the vibration motor 1a or a shock load from the outside. Since the contact portion 4b provided with a circular form, which additionally enables the contact portion 4b to have elasticity, an elastic pressing force against the electrode 6 can be adjusted not only by the torsion coil spring portion 4a but also by the contact portion 4b. Thus, the requirements from assembly manufacturers can be satisfied more quickly and easily and at lower cost.

When the vibration motor 1a is mounted on the circuit board 5, even if a pair of power supply terminals 4 and 4 incline in a winding direction of each torsion coil spring portion 4a (directions of arrows b and c in FIG. 1), the contact portions 4b and 4b contact the plane portion 3f. Thus, the aforementioned inclination is limited within a certain range. Since the power supply terminals 4 hardly incline in a direction opposite to the aforementioned winding direction (since the torsion coil spring portions 4a play a role of stoppers for restricting inclination and are firmly supported by spindle pins 3d and 3d), the power supply terminals 4 and 4 are made elastically deformed in the same direction, thus the contact position with the electrode 6 is uniquely determined. Thus, the efficiency of mounting the vibrator 1a on the surface of the circuit board 5 can be improved, an elastic pressing force against the electrode 6 can be kept constant, and the power supply terminals 4 and 4 is allowed to stably contact with the electrodes 6.

An edge 3g of the terminal block 3b can be provided with a tapered surface. This measure prevents problems that the vibrator 1a cannot be easily mounted on the circuit board 5 because the external peripheral surface of the contact portion 4b is caught by the edge 3g and that the contact portion 4b is deformed because the contact portion is caught by the edge 3g. Therefore, this measure is more preferable for mounting the vibrator 1a.

Second Embodiment

Now the second embodiment of this invention is described referring to FIGS. 7 through 13. The same numbers are given to the same portions as the first embodiment and repetitive descriptions may be omitted or simplified.

The difference of the second embodiment from the first embodiment is that a partition plate 7 is provided between a pair of power supply terminals 4 and 4 having positive and negative polarities, respectively. The partition plate 7 is installed to the bracket 3. In the second embodiment, another mode of a vibrator is described by taking a vibration motor of vibration generation mechanism built-in type 1b (hereafter referred to as a vibration motor 1b) where an eccentric weight is installed to a rotor and accommodated inside the motor housing 2 with a drive mechanism as an example.

Figure 9:
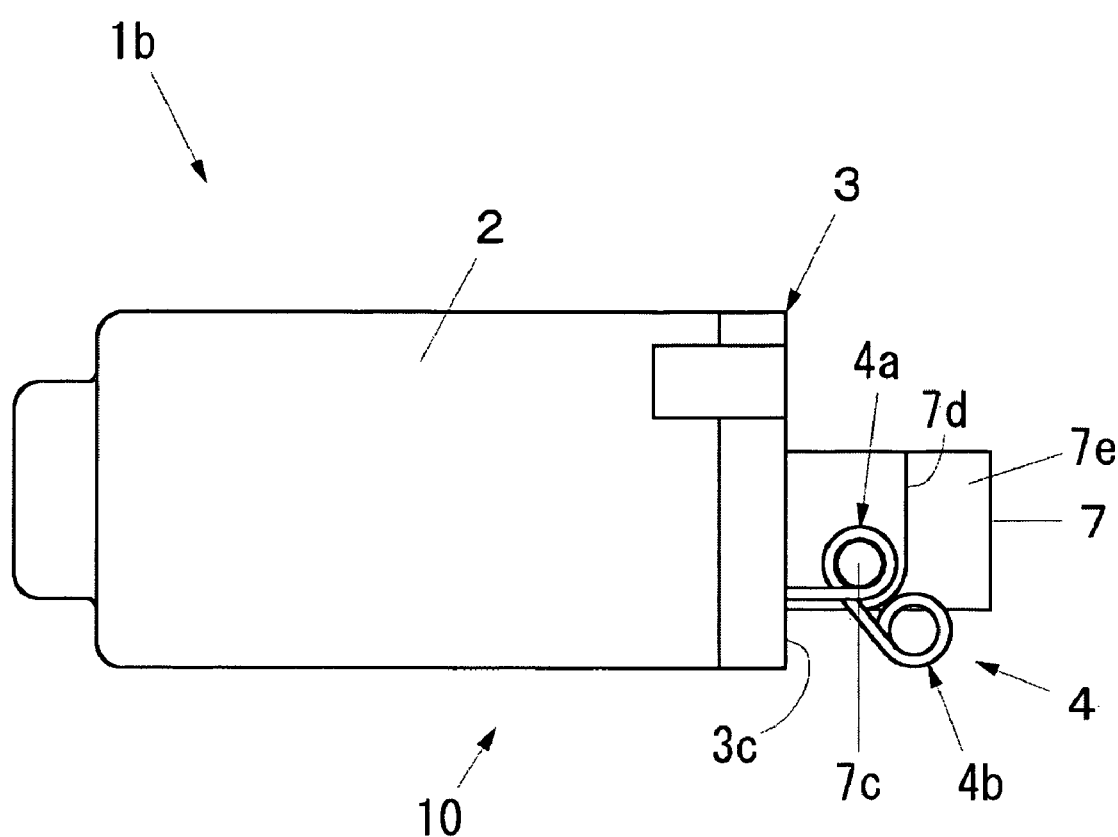
FIG. 9 is a side view of the vibrator shown in FIG. 7 turned upside down and viewed from a side.
Figure 10:
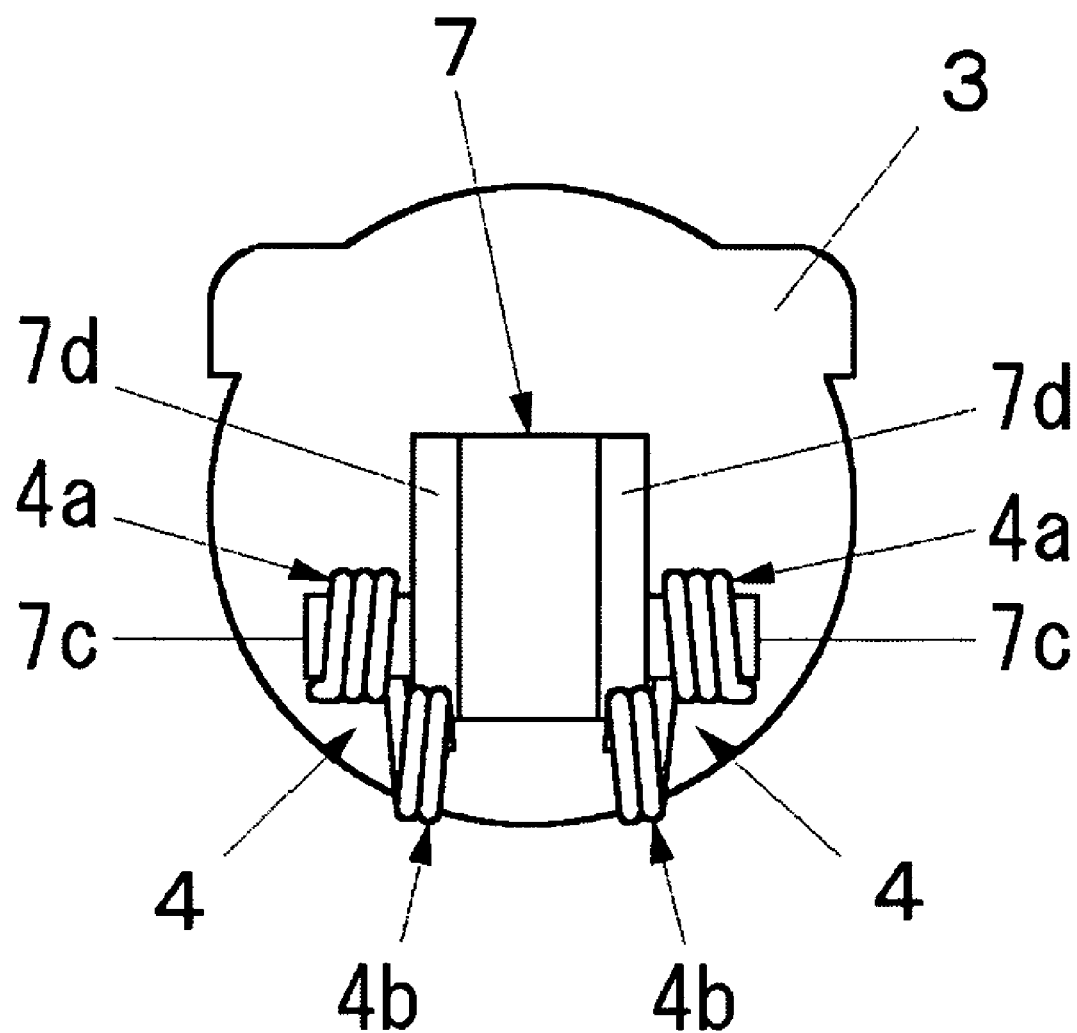
FIG. 10 is a rear view of the vibrator shown in FIG. 9 viewed from the power supply terminal side.
Figure 11:
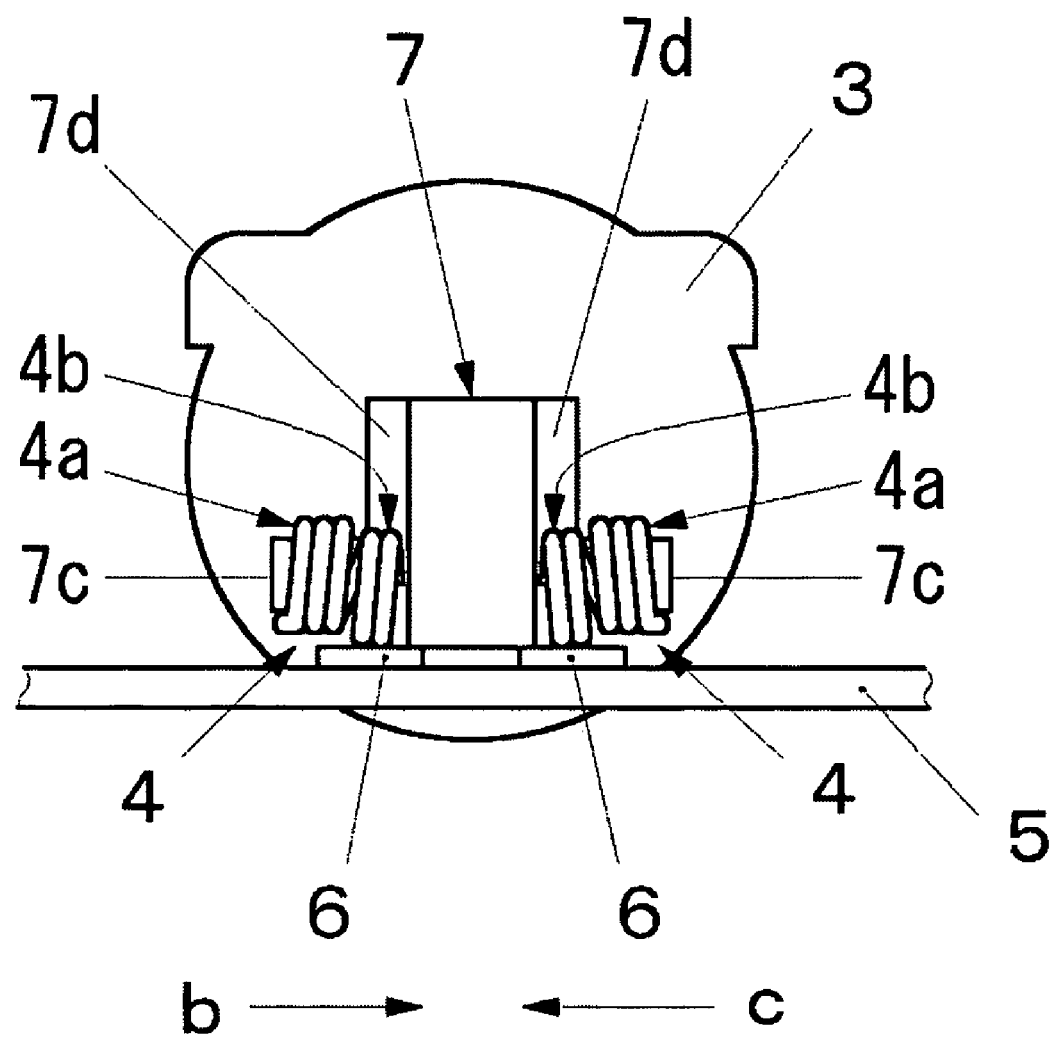
FIG. 11 is a rear view of the vibrator shown in FIG. 7 mounted on the circuit board, viewed from the power supply terminal side.

A part of the contact portions 4b and 4b of the power supply terminals 4 and 4 is partitioned by the partition plate 7 in a condition that the power supply terminals are not mounted on the circuit board as shown in FIGS. 9 and 10. The partition plate 7 is equipped with a spindle pin 7c made from a round rod-shaped insulation material, and a part a rod-shaped member is wound around the spindle pin 7c several turns to form a torsion coil spring portion 4a. The partition plate 7 is also provided with a step portion 7d and a plane portion 7e that are given as a space for enabling the elastic deformation of the power supply terminal 4 without allowing the contact portion 4b to interfere with the partition plate. The contact portion 4b is arranged so that the contact portion faces the plane portion 7e when the power supply terminal 4 is elastically deformed. (See FIG. 13)

When the vibration motor 1b is mounted on a circuit board 5, even if a pair of power supply terminals 4 and 4 incline in a winding direction of each torsion coil spring portion 4a (directions of arrows b and c in the drawing), the contact portions 4b and 4b contact the plane portion 7e because a pair of power supply terminals 4 and 4 are separated by the partition plate 7. Thus, the aforementioned inclination is limited within a certain range. Since the power supply terminal 4 hardly inclines in a direction opposite to the aforementioned winding direction (since the torsion coil spring portions 4a play a role of stoppers for restricting inclination and are firmly supported by spindle pins 7c and 7c), the power supply terminals 4 and 4 are elastically deformed in the same direction, thus the contact position with the electrode 6 is uniquely determined. Thus, the efficiency of mounting the vibrator 1b on the surface of the circuit board 5 can be improved, an elastic pressing force against the electrode 6 can be kept constant, and the power supply terminals 4 and 4 are allowed to stably contact the electrode 6.

Figure 12:
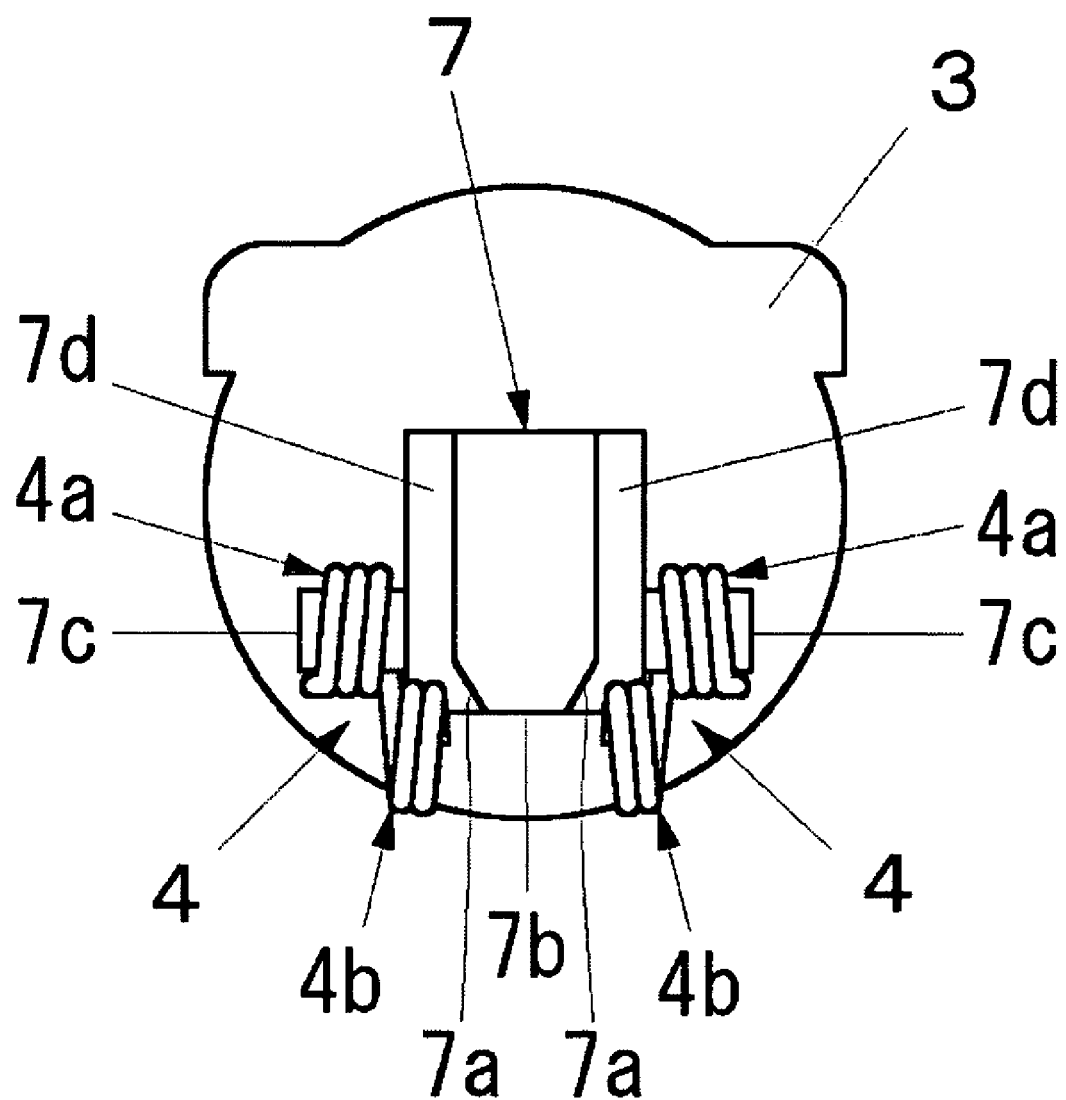
FIG. 12 is a rear view showing a modification of the second embodiment.

Edges of the partition plate 7 located close to the contact portions 4b and 4b can be provided with tapered surfaces 7a as shown in FIG. 12. This measure prevents various kinds of unexpected problems such that the circuit board 5 cannot be easily mounted because the external peripheral surfaces of the contact portions 4b and 4b are caught by the edges of the partition plate 7, that the contact portions 4b and 4b are deformed because the contact portions are caught by the edges, and that the contact portions 4b and 4b are elastically deformed toward a plane 7b of the partition plate 7 to be in contact with each other when the contact portions are pressed onto the circuit board 5. Therefore, this measure is more preferable.

Figure 13:
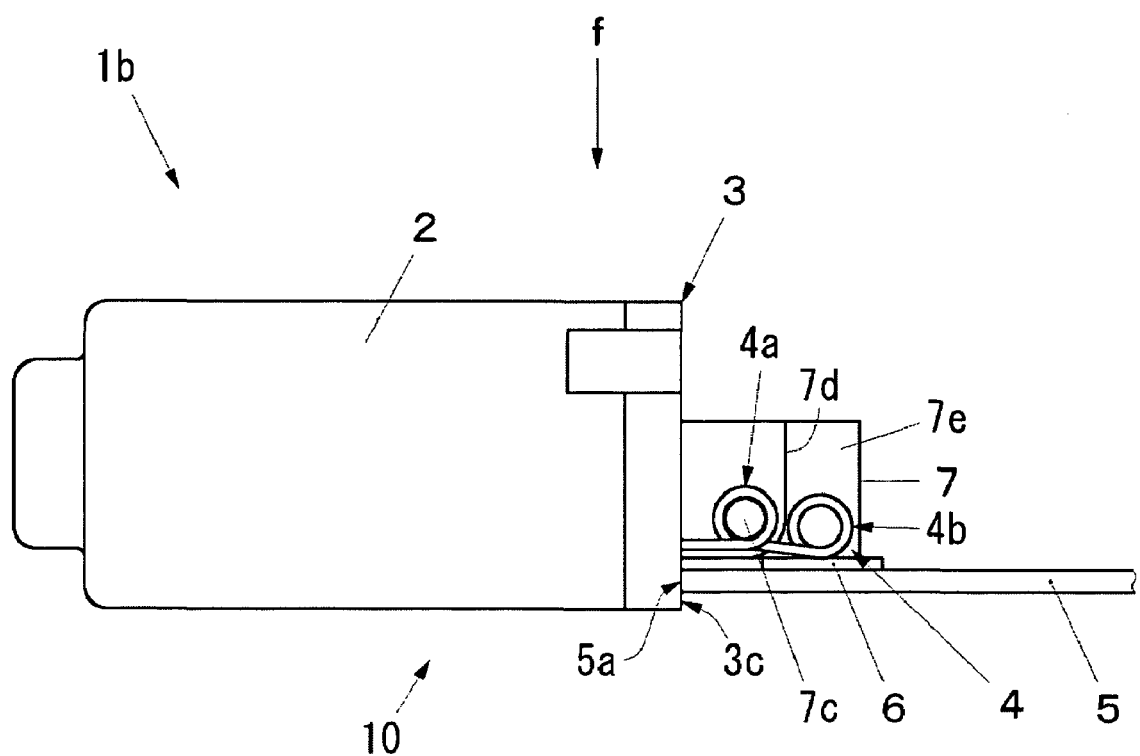
FIG. 13 is a side view of the vibrator shown in FIG. 7 mounted on the circuit board.

As shown in FIG. 13, the power supply terminals 4 and 4 of the vibration motor 1b are arranged on a front face 3c of the bracket 3 and the contact portions of 4b and 4b are allowed to be elastically deformed in a direction toward the outside of a housing 10. Thus, it is possible to constitute the device so that the elastically deformed contact portions 4b protrude toward the outside of the housing 10 in a plan view of the vibration motor 1b (in the direction of arrow f in the drawing) in a condition that the vibration motor 1b is mounted on the surface of the circuit board 5. Therefore, the circuit board 5 can be arranged for the vibration motor 1b so that an end surface 5a is in contact with the aforementioned front face 3c. Thus, an area of the circuit board 5 in contact with the vibration motor 1b can be significantly reduced in comparison with a mounting condition shown in FIG. 5. Consequently, it is possible to make the vibration generated by the vibration motor 1 hardly transmitted to the circuit board 5. Therefore, an amount of vibration transmitted to precise electronic parts, such as IC and LSI mounted on the surface of the circuit board 5, can be reduced, malfunctioning or failure of these precise electronic parts due to vibration can be prevented, and generation of play of the circuit board 5 itself can be prevented.

Since a vibrator is generally mounted on a circuit board and directly fit to a case of a portable terminal device and vibration generated by the vibrator is transmitted to a user through the aforementioned case, reduction of a contact area between the circuit board and the vibrator is not a disadvantage.

Since, in the aforementioned plan view of the vibrator mounted on the circuit board, the contact portion 4b does not overlap the housing 10, it is also possible to restrict the thickness of a device mounted with the circuit board.

Third Embodiment

Figure 14:
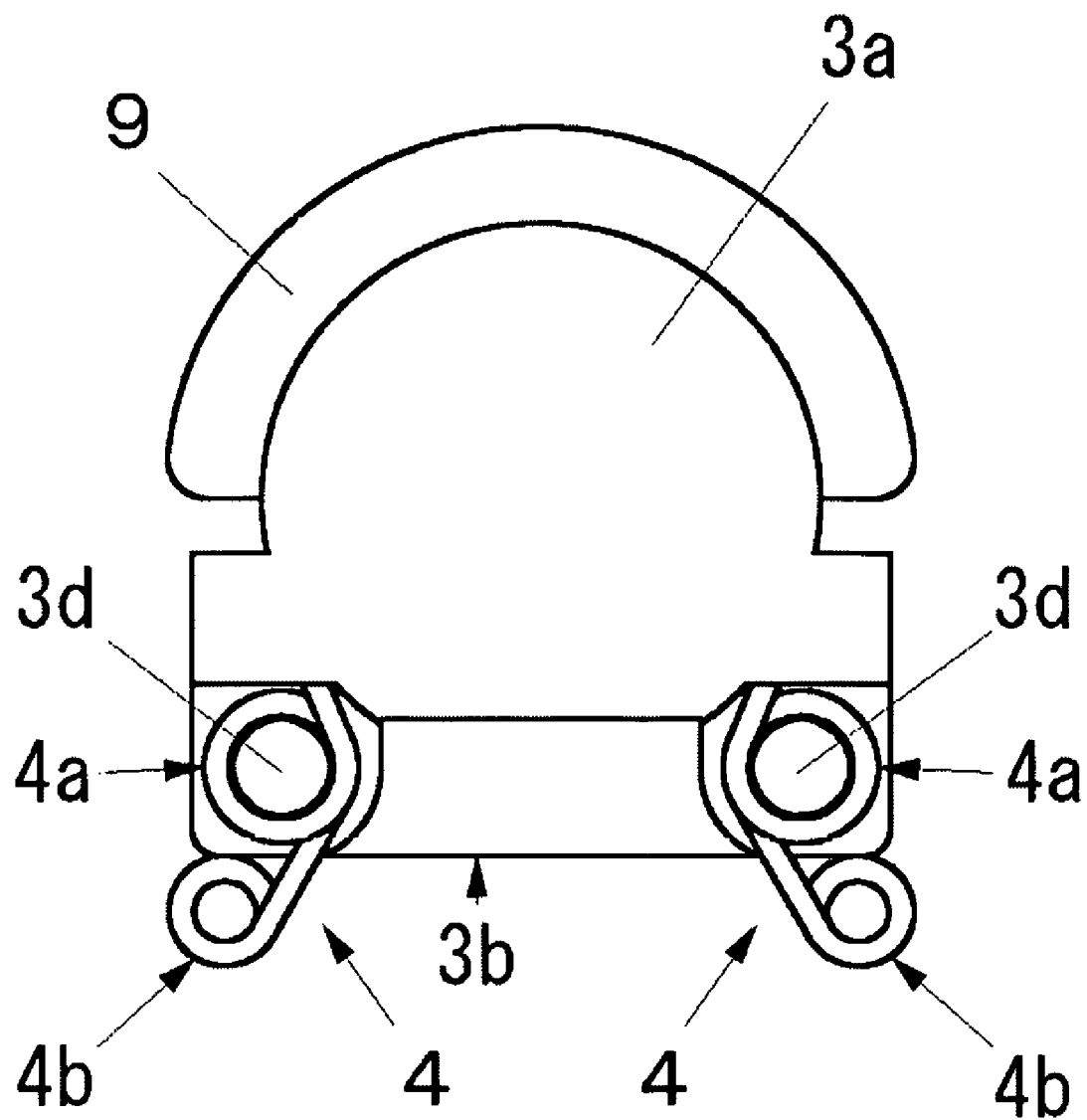
FIG. 14 is a rear view of a vibrator relating to the third embodiment of this invention viewed from the power supply terminal side.
Figure 15:
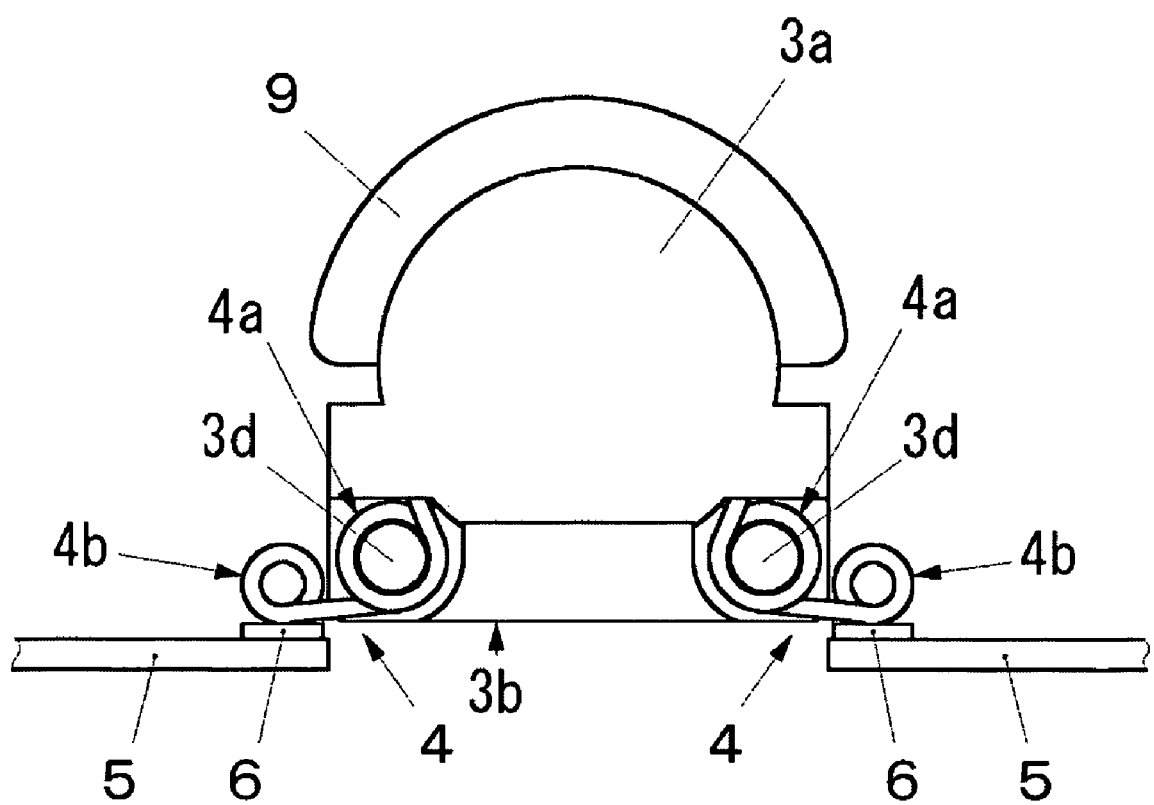
FIG. 15 is a rear view of the vibrator shown in FIG. 14 mounted on the circuit board, viewed from the power supply terminal side.
Figure 16:
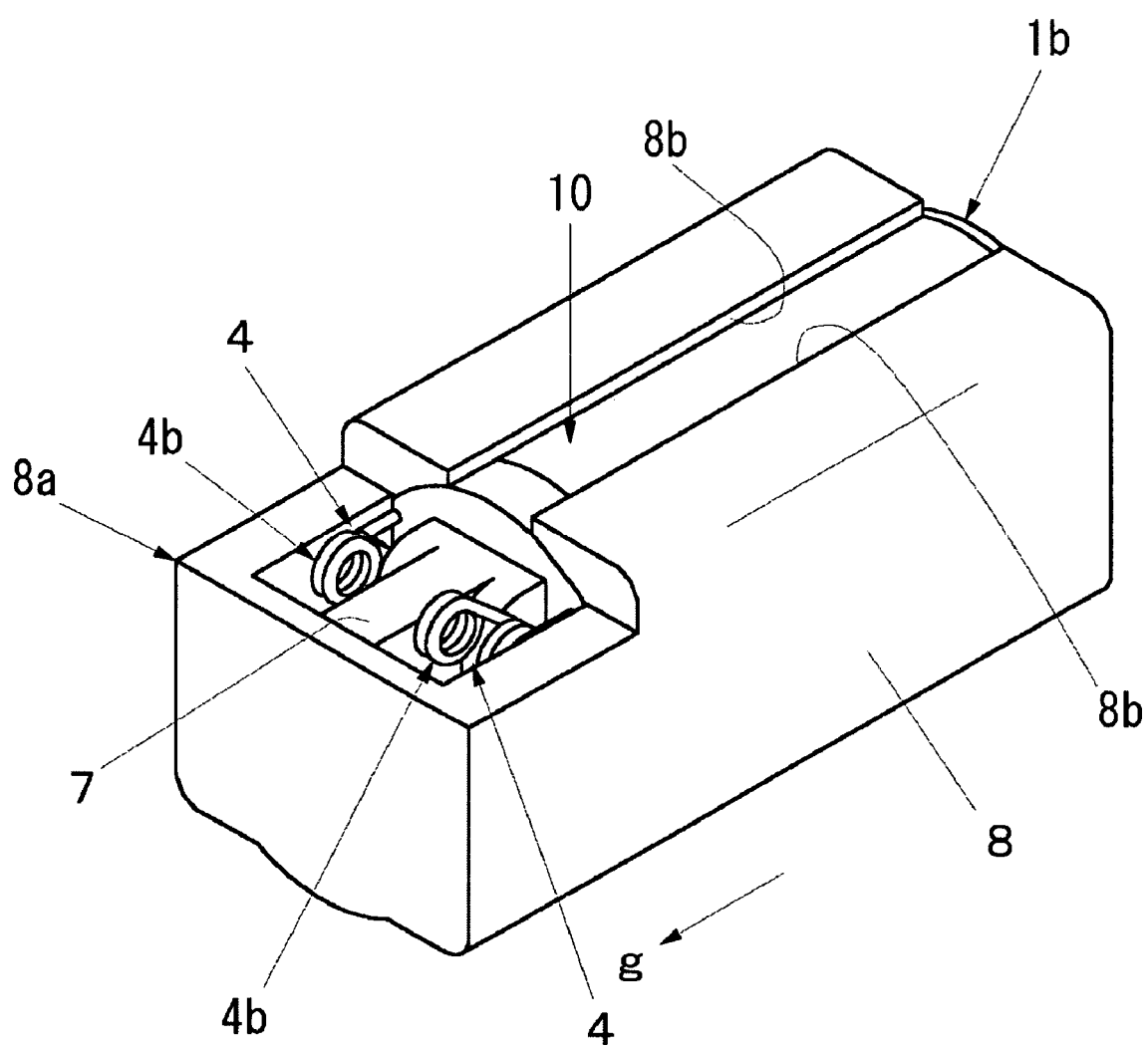
FIG. 16 is a perspective view of a vibrator relating to the fourth embodiment of this invention.
Figure 17:
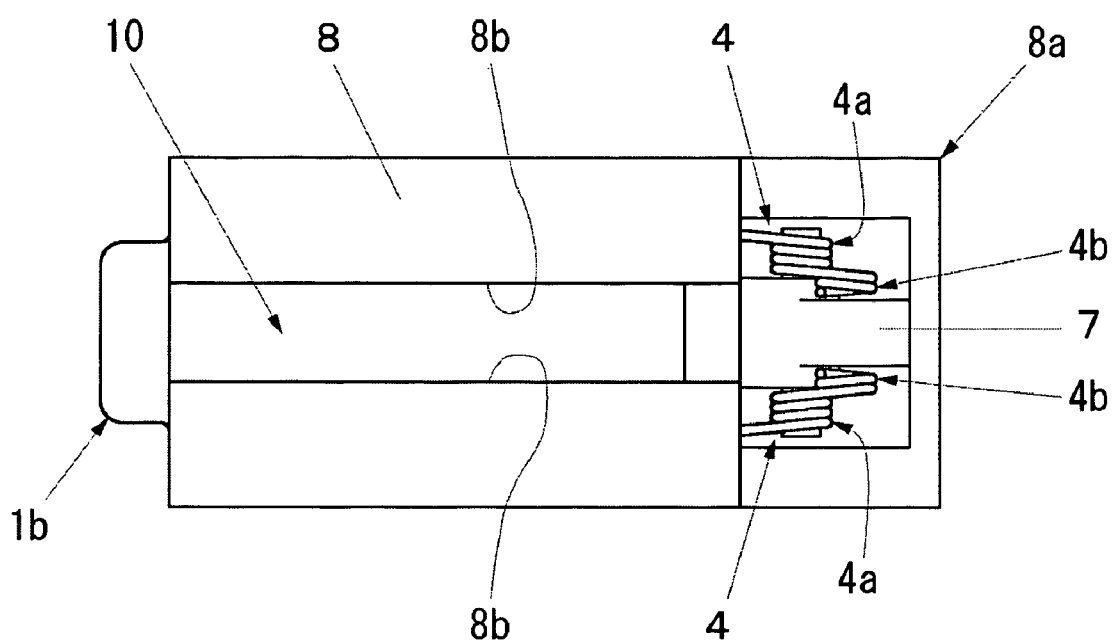
FIG. 17 is a plan view of the vibrator shown in FIG. 16.
Figure 18:
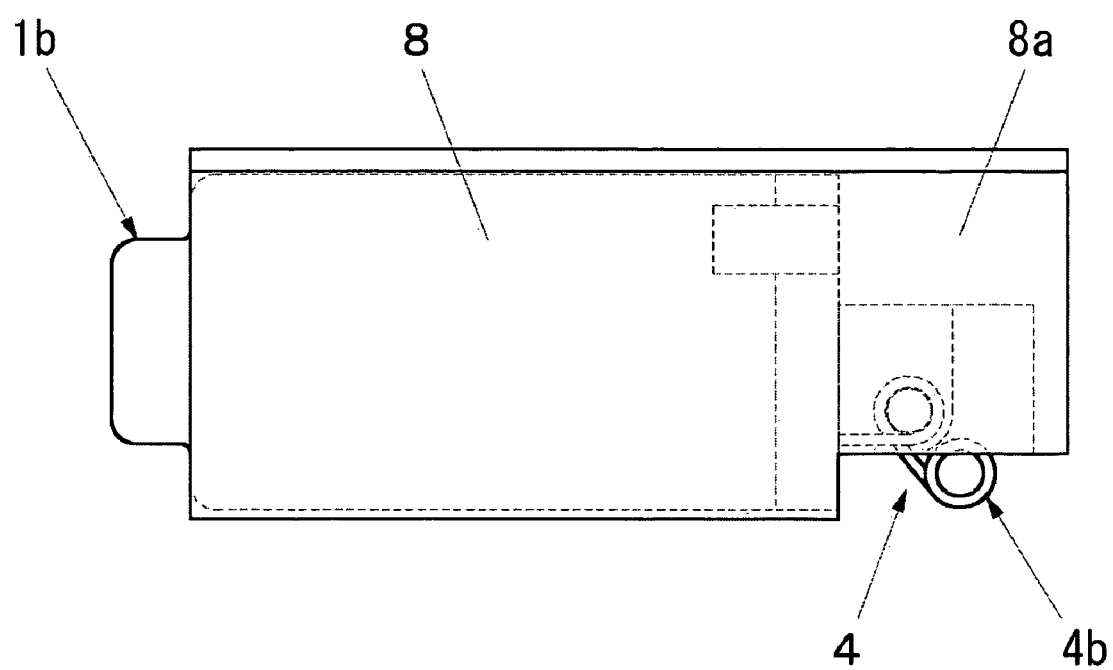
FIG. 18 is a side view of the vibrator shown in FIG. 16 turned upside down and viewed from a side.
Figure 19:
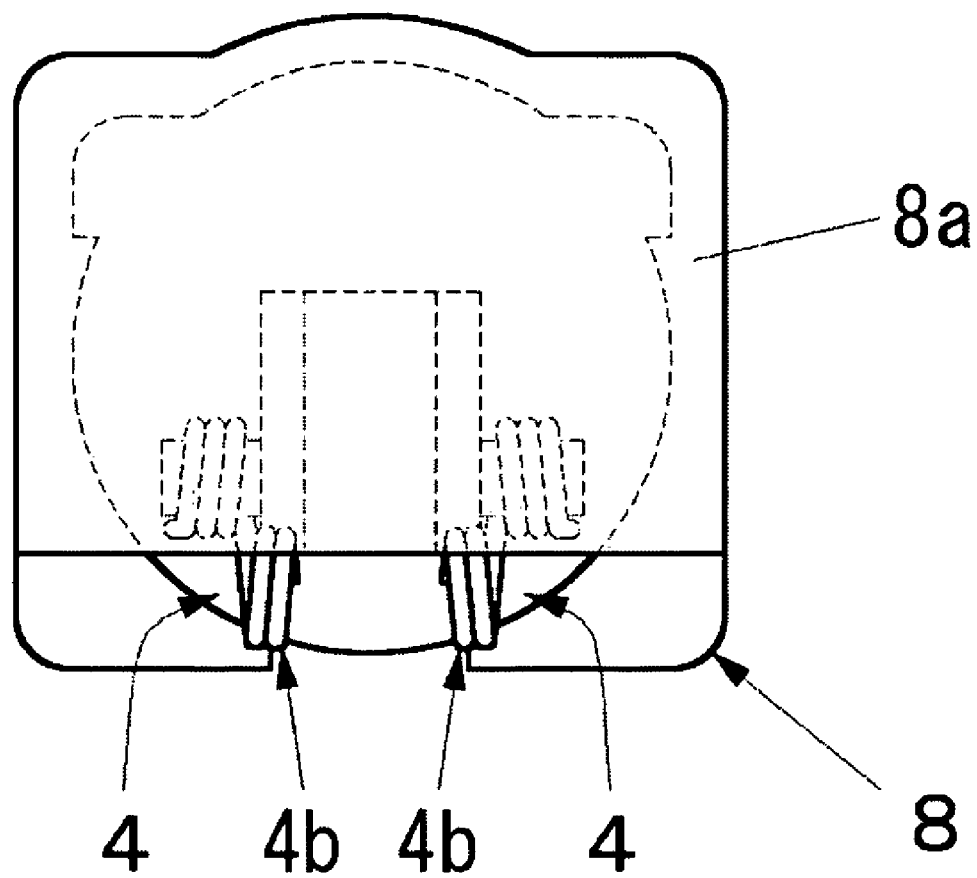
FIG. 19 is a rear view of the vibrator shown in FIG. 18 viewed from the power supply terminal side.

Now the third embodiment of this invention is described referring to FIGS. 14 and 15. The same numbers are given to the same portions as each of the aforementioned embodiments and repetitive descriptions may be omitted or simplified.

The difference of the third embodiment from each of the aforementioned embodiments is that power supply terminals 4 having positive and negative polarities are constituted so as to extend in a bilaterally symmetric direction from torsion coil spring portions 4a of the power supply terminals 4 to the contact portions 4b.

Therefore, when a vibration motor 1a is mounted on a circuit board 5 and the power supply terminals 4 are elastically deformed, contact portions 4b and 4b of the power supply terminals 4 and 4 are located outside torsion coil spring portions 4a and 4a after deformation.

Thus, electrodes 6 and 6 having positive and negative polarities can be separated from each other. Consequently, abnormal short-circuit due to contact between the contact portion and the electrode having different polarities such that the contact portion 4b (either one of FIG. 14 or 15) to be made in contact with an electrode having a positive polarity is erroneously made in contact with an electrode having a negative polarity can be prevented.

Fourth Embodiment

Now the fourth embodiment of this invention is described referring to FIGS. 16 through 19. The same numbers are given to the same portions as each of the aforementioned embodiments and repetitive descriptions may be omitted or simplified.

The difference of the fourth embodiment from each of the aforementioned embodiments is that at least a part of a space where contact portions 4b and 4b can be elastically deformed is surrounded by a box member 8a. The box member 8a is formed integrally with a holder 8. The holder 8 is made from, for example, an elastic member having an insulation property, has an inside diameter portion surrounding an external periphery of a housing 10, and integrally formed so as to be extended toward a power supply terminal 4 in an axial direction of a motor (in the direction of arrow g in the drawing) and so as to have the box member 8a surrounding a periphery of a power supply terminal 4. Therefore, when a vibration motor 1b is wrapped in the holder 8 while widening opening portions 8b, the power supply terminals 4 are also accommodated in the box member 8a.

When attempting to mount this vibration motor 1b on a circuit board, a pair of power supply terminals 4 and 4 start elastic deformation and tend to shift laterally. Therefore, the contact portions 4b and 4b as end portions tend to shift within a range where the power supply terminals 4 and 4 can be elastically deformed. However, when the contact portions 4b and 4b shift laterally, the contact portions contact the inside surfaces of the box member 8a or a partition plate 7, thus further lateral deformation is restricted. That is to say, the inside surfaces of the box member 8a become stoppers of elastic deformation of the contact portions 4b and 4b, playing a role of a guide to allow elastic deformation in a specified direction. Therefore, a lateral shift of the power supply terminals 4 and 4, especially of the contact portions 4b and 4b, can be prevented during mounting, the power supply terminals 4 and 4 are elastically deformed in the same direction easily, thus the contact position between the contact portions 4b and 4b and an electrode 6 can be made invariable. Thus, the efficiency of mounting the vibrator on the surface of the circuit board can be improved, and the contact portion 4b can surely made in contact with the electrode 6.

Since four sides of the contact portion 4b are surrounded by the box member 8a, the contact portion 4b never contacts other parts on the surface of the circuit board. Thus, it is possible to secure a specified elastic pressing force and springiness.

Figure 20:
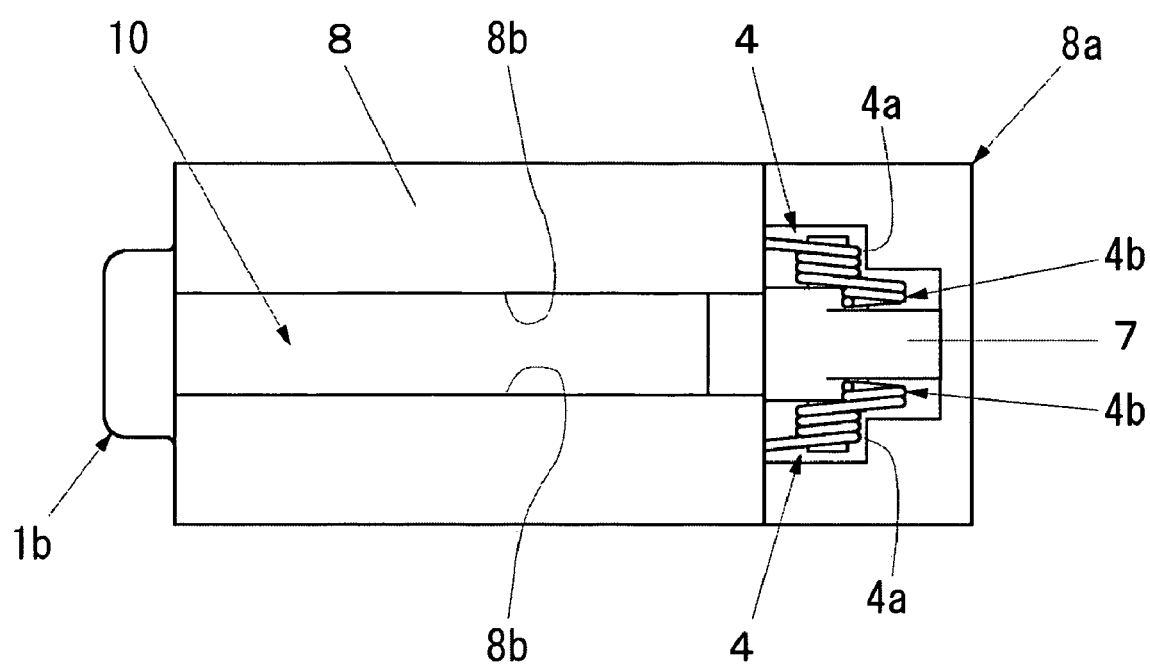
FIG. 20 is a plan view showing a modification of the fourth embodiment.
Figure 21:
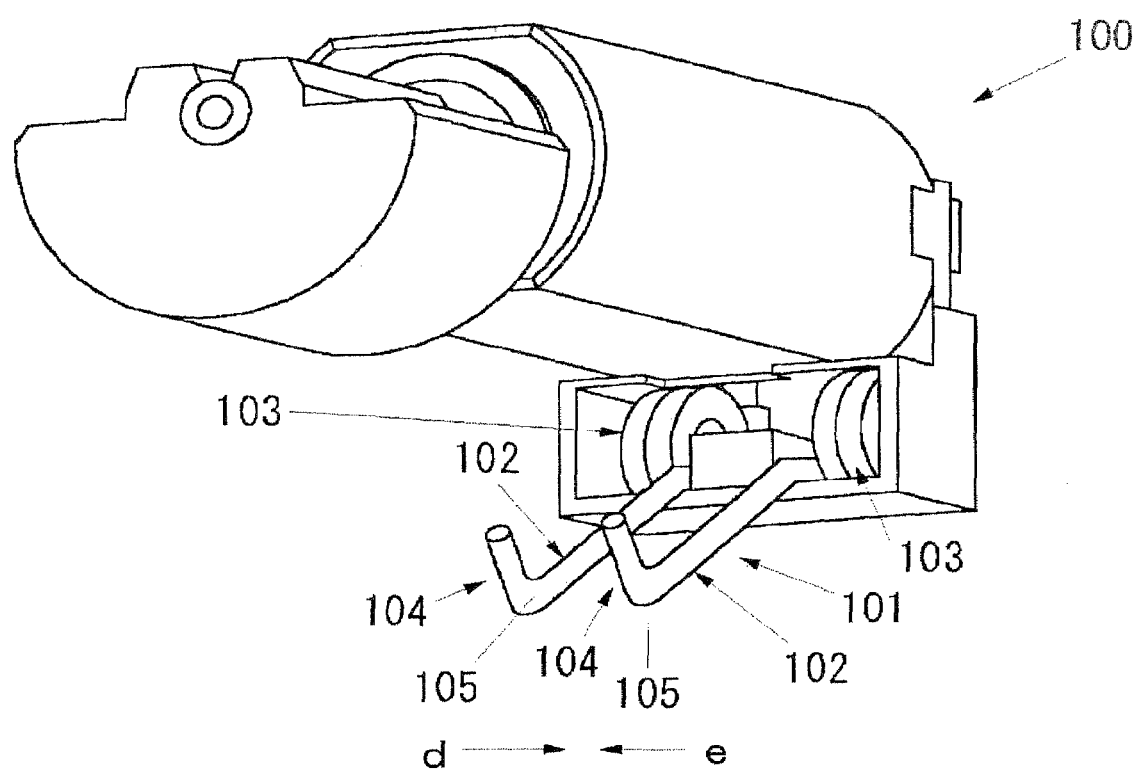
FIG. 21 is a perspective view of a vibrator equipped with conventional torsion coil spring power supply terminals.
Figure 22:
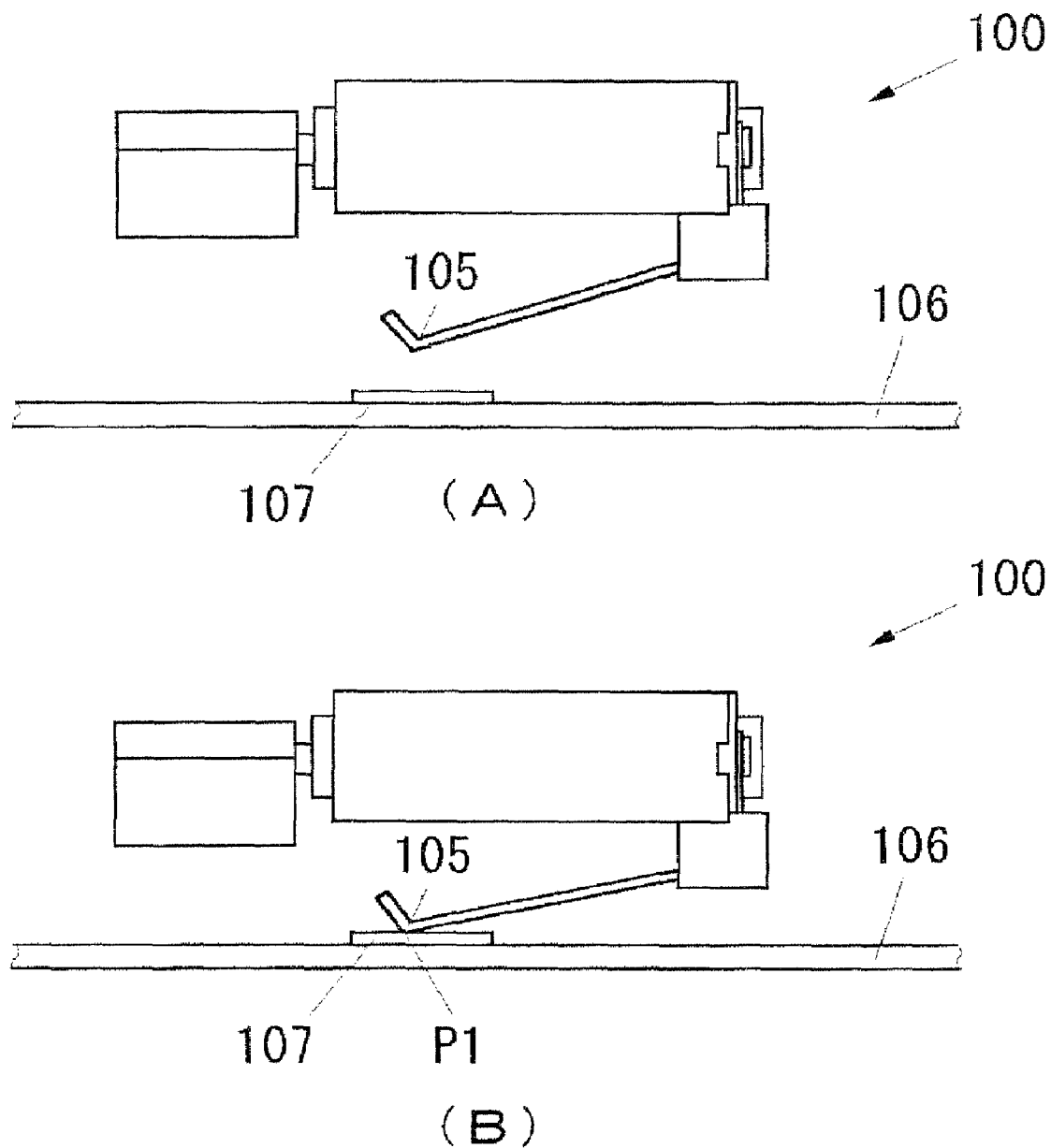
FIG. 22 is a side view of the vibrator shown in FIG. 21 mounted on a circuit board.

By matching the inside surfaces of the box member 8a with the shapes of the power supply terminals 4 in a plan view as shown in FIG. 20, it is possible to further reduce an amount of lateral shift of the power supply terminals 4. Therefore, in addition to the above effects, it is possible to completely keep the inclination of the power supply terminals 4 in the same direction. Thus, the elastic pressing force can be kept constant and the electrode 6 can be made in contact with the contact portions 4b and 4b more stably.

This invention can be modified in various ways based on technical ideas. For example, power supply terminals made from torsion coil springs according to this invention can be added to a type of vibrator having an oscillator of which a vibration generating mechanism is of a reciprocating type. The holder 8 can be made from materials having an insulation property other than elastic materials.

INDUSTRIAL APPLICABILITY

As described above, in the invention according to claim 1 of the present invention, since a power supply terminal is made from a torsion coil spring and a contact portion of the power supply terminal with an electrode is formed by winding, external peripheral surfaces of multiple rings of the aforementioned contact portion can be made in contact with an electrode when a vibrator is mounted on a circuit board. Therefore, the vibrator can be electrically connected to the electrode at multiple contact points. Thus, even if vibration generated by the vibrator or a load acting on a portable terminal device from outside causes a shift of a relative position of the vibrator and the circuit board and the contact point between the aforementioned contact portion and the electrode shift from the original position, any one of the aforementioned multiple external peripheral surfaces is always in contact with the electrode. Thus, it is impossible that the power supply terminal is electrically disconnected from the electrode, and consequently, it is possible to improve the reliability of the power supply performance of the vibrator.

By making a contact portion itself circular, a contact portion with an electrode is allowed to have rigidity even if a rod-shaped member small in diameter is used for the power supply terminal. Therefore, it is possible to make the power supply terminal hardly deformed even if the power supply terminal is subjected to vibration of the vibrator or a shock load from an outside. Moreover, by making a contact portion circular, a contact portion is allowed to have elasticity. Therefore, an elastic pressing force against the electrode can be adjusted not only by a torsion coil spring portion but also by the contact portion. Thus, requirements from assembly manufacturers can be satisfied more quickly and easily and at lower cost.

In the invention according to claim 4, a housing is provided with spindle pins, a torsion coil spring portion is formed by winding a rod-shaped member around the spindle pin, and the housing is provided with a step portion as a space for allowing the aforementioned contact portion to freely move at an elastic deformation of the power supply terminal and a plane portion to which the contact portion of the power supply terminal elastically deformed faces. Therefore, even if power supply terminals incline in a winding direction of each torsion coil spring portion, the contact portions contact the plane portions. Thus, the inclination is limited within a certain range. Therefore, the power supply terminals are made elastically deformed in the same direction, thus the contact position with the electrode is uniquely determined. Thus, efficiency of mounting the vibrator on the surface of the circuit board can be improved, an elastic pressing force against the electrode can be kept constant, and the power supply terminals are allowed to stably contact the electrode.

In the invention according to claim 5, on a plan view of a vibrator in a condition that the vibrator is mounted on a circuit board, the vibrator is provided with power supply terminals so that contact portions are elastically deformed in the direction toward the outside of the housing without allowing the contact portion to overlap the housing. Therefore, an area of a circuit board in contact with the vibrator can be significantly reduced, and consequently, transmission of vibrations generated by the vibrator to the circuit board can be minimized. Therefore, an amount of vibration transmitted to precise electronic parts, such as IC and LSI mounted on the circuit board, can be reduced, malfunctioning or failure of these precise electronic parts due to vibration can be prevented, and generation of play of the circuit board itself can be prevented.

On the aforementioned plan view during mounting, the contact portions do not overlap the housing. Therefore, a thickness of a device when the vibrator is mounted on the surface of the circuit board can be restricted.

In the invention according to one of the claims 6 through 8, a partition plate is provided between a pair of power supply terminals to allow the partition plate to separate a pair of power supply terminals. Therefore, even if a pair of power supply terminals incline in a winding direction of each of torsion coil spring portions when a vibrator is mounted on a circuit board, the aforementioned inclination can be limited within a certain range because the power supply terminal contacts the partition plate. Thus, efficiency of mounting the vibrator on the surface of the circuit board can be improved, an elastic pressing force against the electrode can be kept constant, and the power supply terminals are allowed to stably contact the electrode.

In the invention according to claim 8 or 9, at least a part of a pair of power supply terminals is separated by the aforementioned partition plate, or an edge of the partition plate located close to a contact portion of the power supply terminal is provided with a tapered surface. This measure prevents various kinds of unexpected problems such that the vibrator cannot be easily mounted on a circuit board because an external peripheral surface of the contact portion is caught by an edge of the partition plate, that the contact portion is deformed because the contact portion is caught by the edge, and that the contact portion is elastically deformed in the direction toward a plane of the partition plate to be in contact with each other when the contact portions are mounted on the circuit board. Therefore, this measure is more preferable for mounting a vibrator.

In the invention according to claim 10, power supply terminals having positive and negative polarities are extended in a bilaterally symmetric direction from torsion coil spring portions to contact portions, and the power supply terminal is constructed so that the power supply terminal are elastically deformed to allow each contact portion to reach the outside of each torsion coil spring portion. Therefore, an abnormal short-circuit due to contact between the contact portion and the electrode having different polarities such that the contact portion to be made in contact with an electrode having a positive polarity is erroneously made in contact with an electrode having a negative polarity can be prevented.

In the invention according to claim 11, when the aforementioned vibrator is mounted on the aforementioned circuit board, at least a part of a space where the aforementioned contact portion can elastically deformed is surrounded by an insulation box member. Therefore, even if the contact portions start to shift laterally, the contact portions contact the inside surfaces and further lateral deformation is restricted. That is to say, the inside surfaces of the box member becomes stoppers of the elastic deformation of the contact portions, playing a role of a guide to allow elastic deformation in a specified direction. Therefore, a lateral shift of the contact portions can be prevented during mounting, the contact portions are made elastically deformed easily in the same direction, thus the contact position between the contact portions and an electrode can be made invariable. Thus, efficiency of mounting the vibrator on the surface of the circuit board can be improved and the contact portion can be surely made in contact with the electrode.

Since four sides of the contact portion are surrounded by the box member, the contact portion never contacts other parts on the surface of the circuit board. Thus, it is possible to secure the specified elastic pressing force and springiness.

The invention according to claim 2 or 3 shows a specific example of vibrators based on this invention, and various types of vibrators can be applied to this invention.

The invention according to claim 12 enables the mounting of the vibrator on a portable terminal device by using effects according to the aforementioned claims 1 through 11. That is to say, in a vibrator according to one of the claims 1 through 11, it is possible to realize a portable terminal device mounted with a vibrator comprising a vibration generation mechanism having an eccentric weight or a reciprocating oscillator, a housing for accommodating at least a part of the vibration generation mechanism, and a pair of power supply terminals that protrude from the aforementioned housing having a pair of power supply terminals with positive and negative polarities to supply power to the aforementioned vibration generation mechanism, wherein the aforementioned power supply terminal comprises a torsion coil spring wound around a part of a conductive rod-shaped member having springiness, a contact portion of the aforementioned power supply terminal in contact with the aforementioned electrode is formed by winding, and the contact portion of the aforementioned power supply terminal is pressed toward a circuit board side in the aforementioned device to be in contact with the electrode of the circuit board to be mounted on the portable terminal device to realize electrical connection.

The invention claimed is:

1. A vibrator comprising a vibration generation mechanism, a housing accommodating at least a part of said vibration generation mechanism, and a pair of power supply terminals having positive and negative polarities protruding from said housing that are electrically connected to a corresponding pair of electrodes of a circuit board mounted on a portable terminal device and that supply power to said vibration generation mechanism, wherein each of said pair of power supply terminals comprises:
   a torsion coil spring portion formed of a wound conductive rod-shaped member having springiness, and
   a contact portion configured to be in contact with one of said pair of electrodes and circularly formed in a torsion coil spring configuration.

2. A vibrator according to claim 1, wherein said vibrator is a vibration motor having an eccentric weight.

3. A vibrator according to claim 1, wherein said vibrator has an oscillator of a reciprocating type.

4. A vibrator according to claim 1, wherein said housing is provided with a spindle pin, said torsion coil spring portion is formed as said rod-shaped member is wound around said spindle pin, and said housing is provided with a step portion as a space for allowing said contact portion to freely move during an elastic deformation of said power supply terminal, and a plane portion to which said contact portion faces under elastic deformation.

5. A vibrator according to one of claims 1 through 4, wherein, when that said vibrator is mounted on said circuit board, said contact portions are elastically deformed and are positioned away from each another.

6. A vibrator according to one of claims 1 through 4, wherein a partition plate is provided between said pair of power supply terminals.

7. A vibrator according to one of claims 1 through 3, wherein a partition plate is provided between said pair of power supply terminal, said partition plate is provided with a spindle pin, said torsion coil spring portion is formed said rod-shaped member is wound around said spindle pin, and said partition plate is provided with a step portion as a space for allowing said contact portion to freely move during an elastic deformation of said power supply terminal, and a plane portion to which said contact portion faces under elastic deformation.

8. A vibrator according to claim 6, wherein at least a part of contact portions of said pair of power supply terminals are separated by said partition plate.

9. A vibrator according to claim 6, wherein an edge of a partition plate located close to a contact portion of said power supply terminal is provided with a tapered surface.

10. A vibrator according to one of claims 1 through 4, wherein power supply terminals having positive and negative polarities are extended in a bilaterally symmetric direction from said torsion coil spring portions of said power supply terminals to said contact portions, and said vibrator is constructed so that said power supply terminals are elastically deformed to allow each contact portion to be positioned away from the housing.

11. A vibrator according to one of claims 1 through 4, wherein, when said vibrator is mounted on said circuit board, at least a part of a space where said contact portion can elastically be deformed is partially surrounded by an insulation box member.

12. A portable terminal device with a vibrator, comprising;
a vibration generation mechanism having an eccentric weight or a reciprocating oscillator,
a housing for accommodating at least a part of said vibration generation mechanism, and a pair of power supply terminals having positive and negative polarities that protrude from said housing to supply power to said vibration generation mechanism,
wherein said power supply terminal comprises a torsion coil spring formed from a conductive rod-shaped member having springiness, a contact portion configured as a torsion coil shape to be in contact with said electrode, and said contact portion is configured to be pressed toward a circuit board side in said portable terminal device to be in contact with said electrode of said circuit board when mounted on said device to realize electrical connection.

* * * * *